United States Patent
Yang et al.

(10) Patent No.: US 10,523,369 B2
(45) Date of Patent: *Dec. 31, 2019

(54) MUTUAL-INFORMATION BASED RECURSIVE POLAR CODE CONSTRUCTION

(71) Applicant: QUALCOMM Incorporated, San Diego, CA (US)

(72) Inventors: Yang Yang, San Diego, CA (US); Jing Jiang, San Diego, CA (US); Gabi Sarkis, San Diego, CA (US); Huang Lou, San Diego, CA (US); Hari Sankar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 68 days.

This patent is subject to a terminal disclaimer.

(21) Appl. No.: 15/849,034

(22) Filed: Dec. 20, 2017

(65) Prior Publication Data
US 2018/0198564 A1    Jul. 12, 2018

Related U.S. Application Data

(60) Provisional application No. 62/474,545, filed on Mar. 21, 2017, provisional application No. 62/444,368, filed on Jan. 9, 2017.

(30) Foreign Application Priority Data

Feb. 22, 2017   (WO) ................ PCT/CN2017/074381

(51) Int. Cl.
*H04L 1/16* (2006.01)
*H03M 13/13* (2006.01)
(Continued)

(52) U.S. Cl.
CPC .......... *H04L 1/16* (2013.01); *H03M 13/1105* (2013.01); *H03M 13/1191* (2013.01); *H03M 13/13* (2013.01); *H04L 1/0068* (2013.01)

(58) Field of Classification Search
CPC ....... H04L 1/16; H04L 1/0009; H04L 1/0013; H04L 1/0067; H04L 1/0057;
(Continued)

(56) References Cited

U.S. PATENT DOCUMENTS 10,287,506 B2    5/2019   Lin et al.
2005/0160350 A1  7/2005   Dror et al.
(Continued)

FOREIGN PATENT DOCUMENTS

CN    102122966 A    7/2011
CN    104539393 A    4/2015
(Continued)

OTHER PUBLICATIONS

Arikan E., Channel polarization: A Method for Constructing Capacity-Achieving Codes, 2008 IEEE International Symposium on Information Theory, Aug. 8, 2008 (Aug. 8, 2008), 5 pages.
(Continued)

*Primary Examiner* — Thien Nguyen
(74) *Attorney, Agent, or Firm* — Holland & Hart LLP

(57) ABSTRACT

Decoding and encoding methods, systems, and devices for wireless communication are described. One method may include receiving a codeword over a wireless channel, the codeword being encoded using a polar code, identifying a set of repeated bit locations in the received codeword, and identifying a set of bit locations of the polar code used for information bits for the encoding. The set of bit locations may be determined based at least in part on recursively partitioning bit-channels of the polar code for each stage of polarization and assigning portions of a number of the
(Continued)

information bits to bit-channel partitions of each stage of polarization based on a mutual information transfer function of respective aggregate capacities of the bit-channel partitions. The method may also include decoding the received codeword according to the polar code to obtain an information bit vector at the set of bit locations, and other aspects and features.

30 Claims, 22 Drawing Sheets

(51) Int. Cl.
*H03M 13/11* (2006.01)
*H04L 1/00* (2006.01)

(58) Field of Classification Search
CPC .............. H04L 1/0068; H03M 13/033; H03M 13/6356; H03M 13/6362; H03M 13/1105; H03M 13/1191; H03M 13/13
See application file for complete search history.

(56) References Cited

U.S. PATENT DOCUMENTS

| | | | | |
|---|---|---|---|---|
| 2016/0308644 | A1* | 10/2016 | Shen | H04L 1/0057 |
| 2017/0149531 | A1* | 5/2017 | Raza | G06F 11/10 |
| 2017/0214416 | A1* | 7/2017 | Ge | H03M 13/2927 |
| 2018/0198564 | A1* | 7/2018 | Yang | H03M 13/6356 |
| 2018/0205496 | A1* | 7/2018 | Kudekar | H03M 13/13 |
| 2018/0323809 | A1* | 11/2018 | Lin | H04L 1/00 |
| 2018/0351695 | A1* | 12/2018 | Yang | H03M 13/3944 |
| 2018/0351696 | A1 | 12/2018 | Yang et al. | |

FOREIGN PATENT DOCUMENTS

| | | |
|---|---|---|
| CN | 105430395 A | 3/2016 |
| EP | 0968497 A1 | 1/2000 |
| WO | WO9815945 A1 | 4/1998 |
| WO | WO-2006076213 A1 | 7/2006 |
| WO | WO-2011014738 A2 | 2/2011 |

OTHER PUBLICATIONS

He G., et al., "β-expansion: A Theoretical Framework for Fast and Recursive Construction of Polar Codes", IEEE Global Communications Conference on Information Theory, Apr. 19, 2017, 7 Pages.
Niu K., et al., "Polar Codes: Primary Concepts and Practical Decoding Algorithms", IEEE Communications Magazine, IEEE Service Center, Piscataway, US, vol. 52, No. 7, Jul. 2014, pp. 192-203, XP011553413, ISSN: 0163-6804, DOI: 10.1109/MCOM. 2014.6852102 [retrieved on Jul. 10, 2014].
Mori R., et al., "Performance and Construction of Polar Codes on Symmetric Binary-Input Memoryless Channels", IEEE International Symposium on Information Theory, May 23, 2009, 5 Pages.
Balatsoukas-Stimming A, et al., "Enabling Complexity-Performance Trade-Offs for Successive Cancellation Decoding of Polar Codes", 2014 IEEE International Symposium on Information Theory, IEEE, Jun. 29, 2014, XP032635343, DOI: 10.1109/ISIT. 2014.6875380 [retrieved on Aug. 8, 2014], pp. 2977-2981.
International Search Report and Written Opinion—PCT/US2018/ 012569—ISA/EPO—dated Apr. 18, 2018.
Samsung: "Discussion on Flexible Polar Codes", 3GPP Draft; R1-166773 Discussion_On_Flexibile_Polar_Codes, 3rd Generation Partnership Project (3GPP), Mobile Competence Centre; 650, Route Des Lucioles; F-06921 Sophia-Antipolis Cedex; France, vol. RAN WG1, No. Gothenbourg, Sweden; Aug. 22, 2016-Aug. 26, 2016 Aug. 13, 2016, XP051142464, Retrieved from the Internet: URL:http:// www.3gpp.org/ftp/tsg_ran/WG1_RL1/TSGR1_86/Docs/ [retrieved on Aug. 13, 2016], 4 pages.
Tal I., et al., "How to Construct Polar Codes", IEEE Transactions on Information Theory, Apr. 10, 2013, pp. 1-21.
Tal I., et al., "List Decoding of Polar Codes", IEEE Transactions on Information Theory, May 31, 2012, pp. 1-11.
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012. 081512.110872, pp. 3221-3227.

\* cited by examiner

MUTUAL-INFORMATION BASED RECURSIVE POLAR CODE CONSTRUCTION

CROSS REFERENCE & PRIORITY CLAIM

The present Application for Patent claims priority to and benefit of U.S. Provisional Patent Application No. 62/474,545 by YANG, et al., entitled "Mutual-Information Based Recursive Polar code Construction," filed Mar. 21, 2017, U.S. Provisional Patent Application No. 62/444,368 by JIANG, et al., entitled "Bit Allocation for Encoding and Decoding," filed Jan. 9, 2017, and PCT Application No. PCT/CN2017/074381 by YANG, et al., entitled "Mutual-Information Based Recursive Polar code Construction," filed Feb. 22, 2017, each of which is assigned to the assignee hereof and incorporated herein by reference as if fully set forth below for all applicable purposes.

TECHNICAL FIELD

The technology described below relates generally to wireless communication and more specifically to mutual-information based recursive polar code construction. Embodiments of the technology can enable and provide coding and decoding wireless communication signals to yield improved data transmission reliability, efficient processing, high data throughput, and enhanced user experience.

INTRODUCTION

Wireless communications systems are widely deployed to provide various types of communication content such as voice, video, packet data, messaging, broadcast, and so on. These systems can support communication with multiple users by sharing available system resources (e.g., time, frequency, and power). Examples of multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless data signals, sometimes called code blocks, may be encoded by a transmitting device (e.g., a base station or UE) using an encoding algorithm. Signal coding aids with transmitting data across a lossy air channel. Error correcting codes may be used to introduce redundancy in a code block, for example at a transmitter, so that a receiver may detect and correct transmission errors.

A variety of coding techniques are utilized. Some examples of encoding algorithms with error correcting codes include convolutional codes (CCs), low-density parity-check (LDPC) codes, and polar codes. Some coding techniques, such as polar coding, use reliability metrics during encoding and decoding such that information bits may be loaded on channel instances (of the encoder or decoder) that are associated with favorable (e.g., high) reliability metrics. Selection of channel instances used for information bits may present challenges when implemented in a system where a flexible bit rate for processing bits for a transmission is desired.

BRIEF SUMMARY

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

The present disclosure describes techniques for encoding and decoding a codeword using a polar code when one or more bits are punctured. The present disclosure also describes techniques for encoding and decoding a codeword using a polar code when one or more bits of the codeword are repeated, which may leave other bits of the codeword blank, such that the blank bits may be treated similarly to punctured bits.

In some cases, a codeword encoded using a polar code may be punctured. For example, to achieve a given code rate with an encoder having lengths determined by a power function (e.g., $2^N$), more bits may be generated from encoding than are transmitted for the given code rate. A punctured bit may be a bit for which no information is transmitted (e.g., the bit is skipped), or a bit that is used for another purpose (e.g., transmission of a reference signal, etc.).

A method for wireless communication is described. The method may include receiving an encoded codeword over a wireless channel via a wireless communication interface configured to receive wireless data signals, identifying a set of repeated bit locations in the received codeword, identifying a set of bit locations of a polar code used for information bits for the encoding, wherein the set of bit locations is determined based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations, and decoding the received codeword according to the polar code to obtain an information bit vector at the set of bit locations.

An apparatus for wireless communication is described. The apparatus may include means for receiving an encoded codeword over a wireless channel via a wireless communication interface configured to receive wireless data signals, means for identifying a set of repeated bit locations in the received codeword, means for identifying a set of bit locations of a polar code used for information bits for the encoding, wherein the set of bit locations is determined based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations, and means for decoding the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive an encoded codeword over a wireless channel via a wireless communication interface configured to receive wireless data signals, identify a set of repeated bit locations in the received codeword, identify a set of bit locations of a polar code used for information bits for the encoding, wherein the set of bit locations is determined based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations, and decode the received codeword according to the polar code to obtain an information bit vector at the set of bit locations.

A non-transitory computer readable medium for wireless communication is described. The non-transitory computer-readable medium may include instructions operable to cause a processor to receive an encoded codeword over a wireless channel via a wireless communication interface configured to receive wireless data signals, identify a set of repeated bit locations in the received codeword, identify a set of bit locations of a polar code used for information bits for the encoding, wherein the set of bit locations is determined based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein a target mutual information for a first polarization stage is determined as a function of the number of the information bits and a number of un-punctured bit locations in the received codeword, and wherein zero information bits are assigned to a first bit-channel partition of the first polarization stage, the first bit-channel partition corresponding to the set of repeated bit locations, and decode the received codeword according to the polar code to obtain an information bit vector at the set of bit locations.

Some examples of the method, apparatus, and non-transitory computer-readable medium described above may including determining that the target mutual information is greater than the number of the information bits divided by the number of bit locations in the received codeword.

Some examples of the method, apparatus, and non-transitory computer-readable medium described above may include determining, for the each stage of polarization, a capacity of each bit-channel of each of the bit-channel partitions, based at least in part on bit-channel capacities of input bit-channels from the previous stage of polarization and the mutual information transfer function. In some examples of the method, apparatus, and non-transitory computer-readable medium described above, the set of repeated bit locations correspond to at least one of a most significant bit portion of the received codeword, a least significant bit portion of the received codeword, an intermediate portion of the received codeword between a most significant bit and a least significant bit, or a combination thereof.

In some examples of the method, apparatus, and non-transitory computer-readable medium described above, the mutual information transfer function may be based on a binary erasure channel (BEC) function and a correction term. In some examples of the method, apparatus, and non-transitory computer-readable medium described above, the target mutual information may be associated with at least one reliability metric. In some examples, the at least one reliability metric may be associated with a capacity of at least one of the bit-channels to successfully convey at least some of the information bits.

In some examples of the method, apparatus, and non-transitory computer-readable medium described above, at least one of the bit-channel partitions may be associated with a first group, and at least one other of the bit-channel partitions may be associated with a second group. Some examples of the method, apparatus, and non-transitory computer-readable medium described above may include associating at least one of the bit-channel partitions with a first group, and associating at least one other of the bit-channel partitions with a second group. In some examples of the method, apparatus, and non-transitory computer-readable medium described above, the first group may include a lower reliability group, and the second group may include a higher reliability group.

In some examples of the method, apparatus, and non-transitory computer-readable medium described above, at least some of the repeated bit locations may be at least in part indicative that other bit locations of the codeword may be blank.

In some examples of the method, apparatus, and non-transitory computer-readable medium described above, the recursively partitioning bit-channels of the polar code for each stage of polarization may occur prior to the assigning.

In some examples of the method, apparatus, and non-transitory computer-readable medium described above, the recursively partitioning the bit-channels may be based at least in part on allocating a threshold number of bit locations to more than one of the bit-channels.

In some examples of the method, apparatus, and non-transitory computer-readable medium described above, the target mutual information may be based at least in part on the mutual information transfer function.

A method for wireless communication is described. The method may include receiving an encoded codeword over a wireless channel via a wireless communication interface configured to receive wireless data signals, identifying a set of bit locations of a polar code used for information bits for the encoding, wherein the set of bit locations is identified based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, and processing the received codeword according to the polar code to obtain an information bit vector at the set of bit locations.

An apparatus for wireless communication is described. The apparatus may include means for receiving an encoded codeword over a wireless channel via a wireless communication interface configured to receive wireless data signals, means for identifying a set of bit locations of a polar code used for information bits for the encoding, wherein the set of bit locations is identified based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, and means for processing the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive an encoded codeword over a wireless channel via a wireless communication interface configured to receive wireless data signals, identify a set of bit locations of a polar code used for information bits for the encoding, wherein the set of bit locations is identified based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, and process the received codeword according to the polar code to obtain an information bit vector at the set of bit locations.

A non-transitory computer readable medium for wireless communication is described. The non-transitory computer-readable medium may include instructions operable to cause a processor to receive an encoded codeword over a wireless channel via a wireless communication interface configured to receive wireless data signals, identify a set of bit locations of a polar code used for information bits for the encoding, wherein the set of bit locations is identified based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, and process the received codeword according to the polar code to obtain an information bit vector at the set of bit locations.

In some examples of the method, apparatus, and non-transitory computer-readable medium described above, the correction term may be based on a function of a bit-channel capacity of the each stage of polarization and a capacity imbalance factor. In some examples of the method, apparatus, and non-transitory computer-readable medium described above, the correction term may include at least one of an offset factor applied to the bit-channel capacity, a scaling factor applied to the offset bit-channel capacity, or an offset applied to the scaled and offset bit-channel capacity.

In some examples of the method, apparatus, and non-transitory computer-readable medium described above, the mutual information transfer function may be based at least in part on at least one reliability metric.

In some examples of the method, apparatus, and non-transitory computer-readable medium described above, at least one of the bit-channel partitions may be associated with a lower reliability group and at least one other of the bit-channel partitions may be associated with a higher reliability group. Some examples of the method, apparatus, and non-transitory computer-readable medium described above may include associating at least one of the bit-channel partitions with a lower reliability group, and associating at least one other of the bit-channel partitions a higher reliability group.

A method for wireless communication is described. The method may include identifying a set of repeated bit locations for transmission of a codeword, the codeword to be generated from an information bit vector using a polar code, identifying a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, encoding the information bit vector mapped to the set of bit locations using the polar code to obtain the codeword, and wherein zero information bits are assigned to a first bit-channel partition of the first polarization stage, the first bit-channel partition corresponding to the set of repeated bit locations, and transmitting the codeword over a wireless channel.

An apparatus for wireless communication is described. The apparatus may include means for identifying a set of repeated bit locations for transmission of a codeword, the codeword to be generated from an information bit vector using a polar code, means for identifying a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations, means for encoding the information bit vector mapped to the set of bit locations using the polar code to obtain the codeword, and means for transmitting the codeword over a wireless channel.

Another apparatus for wireless communication is described. The apparatus may include a processor, memory in electronic communication with the processor, and instructions stored in the memory. The instructions may be operable to cause the processor to identify a set of repeated bit locations for transmission of a codeword, the codeword to be generated from an information bit vector using a polar code, identify a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations, encode the information bit vector mapped to the set of bit locations using the polar code to obtain the codeword, and transmit the codeword over a wireless channel.

A non-transitory computer readable medium for wireless communication is described. The non-transitory computer-readable medium may include instructions operable to cause a processor to identify a set of repeated bit locations for transmission of a codeword, the codeword to be generated from an information bit vector using a polar code, identify a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, encode the information bit vector mapped to the set of bit locations using the polar code to obtain the codeword, and wherein zero information bits are assigned to a first bit-channel partition of the first polarization stage, the first bit-channel partition corresponding to the set of repeated bit locations, and transmit the codeword over a wireless channel.

In some examples of the method, apparatus, and non-transitory computer-readable medium described above, the target mutual information may be determined to be greater than the number of the information bits divided by the number of bit locations in the transmitted codeword.

In some examples of the method, apparatus, and non-transitory computer-readable medium described above, for the each stage of polarization, a capacity of each bit-channel of each of the bit-channel partitions may be determined based on bit-channel capacities of input bit-channels from the previous stage of polarization and the mutual information transfer function.

In some examples of the method, apparatus, and non-transitory computer-readable medium described above, the set of repeated bit locations correspond to at least one of a most significant bit portion of the transmitted codeword, a least significant bit portion of the transmitted codeword, an intermediate portion of the transmitted codeword between a most significant bit and a least significant bit, or a combination thereof.

In some examples of the method, apparatus, and non-transitory computer-readable medium described above, the mutual information transfer function may be based on a BEC function and a correction term.

A method for wireless communication is described. The method may include identifying an information bit vector for encoding using a polar code, identifying a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, encoding the information bit vector mapped to the set of bit locations using the polar code to obtain a codeword, and transmitting the codeword over a wireless channel.

An apparatus for wireless communication is described. The apparatus may include means for identifying an information bit vector for encoding using a polar code, means for identifying a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, means for encoding the information bit vector mapped to the set of bit locations using the polar code to obtain a codeword, and means for transmitting the codeword over a wireless channel.

Another apparatus for wireless communication is described. The apparatus may include a processor, memory in electronic communication with the processor, and instructions stored in the memory. The instructions may be operable to cause the processor to identify an information bit vector for encoding using a polar code, identify a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, encode the information bit vector mapped to the set of bit locations using the polar code to obtain a codeword, and transmit the codeword over a wireless channel.

A non-transitory computer readable medium for wireless communication is described. The non-transitory computer-readable medium may include instructions operable to cause a processor to identify an information bit vector for encoding using a polar code, identify a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations, encode the information bit vector mapped to the set of bit locations using the polar code to obtain a codeword, and transmit the codeword over a wireless channel.

In some examples of the method, apparatus, and non-transitory computer-readable medium described above, the correction term may be based on a function of a bit-channel capacity of the each stage of polarization and a capacity imbalance factor. In some examples of the method, apparatus, and non-transitory computer-readable medium described above, the correction term may include an offset factor applied to the bit-channel capacity. In some examples of the method, apparatus, and non-transitory computer-readable medium described above, the correction term may include a scaling factor applied to the offset bit-channel capacity. In some examples of the method, apparatus, and non-transitory computer-readable medium described above, the correction term may include an offset applied to the scaled and offset bit-channel capacity.

Other aspects, features, and embodiments of the technology will become apparent to those of ordinary skill in the art, upon reviewing the following description of specific, exemplary embodiments in conjunction with the accompanying figures. While features of the technology discussed below may be described relative to certain embodiments and figures below, all embodiments can include one or more of the advantageous features discussed. While one or more embodiments may be discussed as having certain advantageous features, one or more of such features may also be used in accordance with the various embodiments discussed. In similar fashion, while exemplary embodiments may be discussed below as device, system, or method embodiments it should be understood that such exemplary embodiments can be implemented in varying shapes, sizes, layouts, arrangements, circuits, devices, systems, and methods.

DETAILED DESCRIPTION

Figure 1:
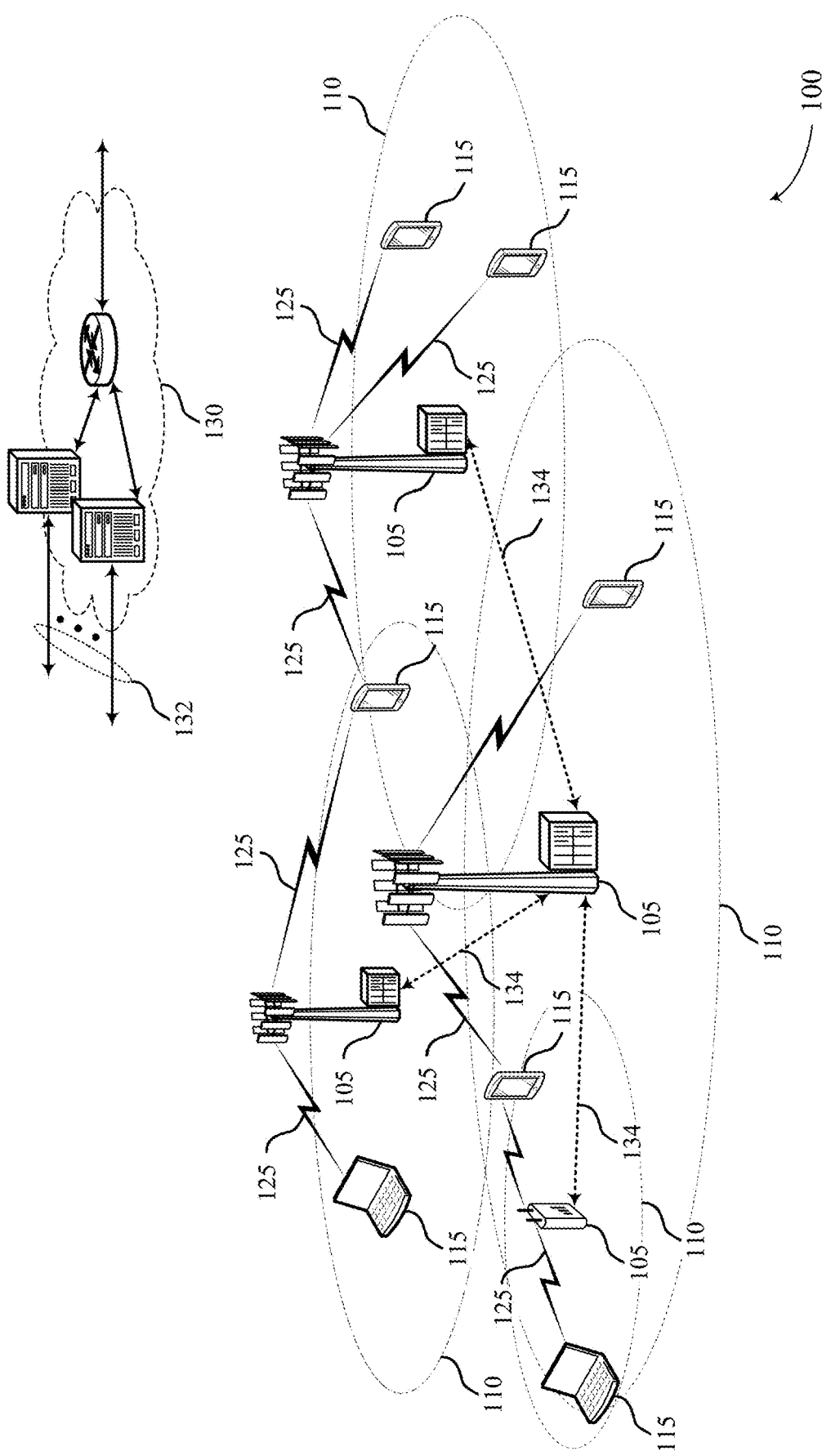
FIG. 1 illustrates an example of a wireless communications system that supports a mutual-information based recursive polar code construction in accordance with various aspects of the present disclosure.

Techniques are described for enhanced performance of polar codes where puncturing or bit repetition is employed. According to one implementation, a base station may encode a set of bits for a transmission to a UE using a polar code. The number of bits generated by a polar-code encoder may be determined based on a power function (e.g., $2^N$). To achieve a given code rate or codeword size for a transmission, more bits may be generated than are transmitted for the given code rate or codeword size. In such cases, a base station may puncture encoded bits to satisfy a given code rate. That is, a base station may rate match an output codeword of the polar-code encoder to a number of desired bits for the given code rate by not transmitting some of the encoded bits. Because polar code construction may not account for the punctured bits, gains associated with using a polar code may be compromised. This may result in reduced throughput in a wireless communications system. In the case of bit repetition, blank bits of the codeword may be treated similarly to punctured bits.

Some wireless communications systems may support efficient techniques for accommodating puncturing in a polar coding scheme. An encoder may identify a target mutual information for a transmission, and the encoder may polarize bit-channels based on the target mutual information. The resulting polarized bit-channels may then be partitioned into groups, each associated with a specific capacity (or mutual information) that corresponds to the reliability of the bit-channels in the group. Polarization of the bit-channels and partitioning of the bit-channels into different groups may be done recursively. Recursive operations can occur until a block size of a group of polarized bit-channels is appropriately sized (e.g., below a certain threshold or the error due to dividing an integer number of bit locations is above a certain threshold). Information bits may then be distributed to the polarized bit-channels based on the allocations (e.g., distributed within each block according to polarization weight or a predetermined bit-channel ranking within each block).

However, conventional systems may not adequately account for the possibility that—if a set of bits is punctured for the transmission, the capacity (or target mutual information) of the unpolarized bit-channels may be different (e.g., some unpolarized bit-channels may have zero capacity because they are not transmitted in the punctured codeword). As described herein, an encoder may employ a polar coding scheme that accounts for differences in capacity of the unpolarized bit-channels based on the number of bits punctured for a transmission. Specifically, initial target mutual information and recursive partitioning may be adjusted for the puncturing. For example, as the polarized bit-channels are recursively partitioned into groups, the effect of capacity differences due to punctured bits is propagated to each set of partitioned bit-channels. Thus, the number of information bits allocated to each partitioned bit-channel group accounts for the punctured bit-channels. As such, the adjusted initial capacity (or number of un-punctured bits) may be distributed to the different groups of polarized bit-channels appropriately, and, the information bits of the transmission may be allocated to the most reliable polarized bit-channels.

Aspects of the disclosure introduced above are described below in the context of a wireless communications system. Examples of processes and signaling exchanges that support a mutual-information based recursive polar code construction are then described. Aspects of the disclosure are further illustrated by and described with reference to apparatus diagrams, system diagrams, and flowcharts that relate to a mutual-information based recursive polar code construction.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

FIG. 1 illustrates an example of a wireless communications system 100 that supports a mutual-information based recursive polar code construction in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile or vehicular component, medical device, entertainment device, industrial equipment, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

In some cases, a base station 105 may encode a set of bits for a transmission to a UE 115 using a polar code. The number of bits generated by a polar code encoder may be determined based on a power function (e.g., $2^N$). Thus, in order to achieve a given code rate or codeword size for a transmission, more bits may be generated by the polar code than are transmitted for the given code rate or codeword size. In such cases, the base station 105 may puncture the encoded bits to satisfy the given code rate. That is, the base station 105 may rate match the output codeword of the polar code encoder to a number of desired bits for the given code rate by not transmitting some of the encoded bits. Because the polar code may not account for the punctured bits, the gains associated with using the polar code may be compromised, which may result in reduced throughput in a wireless communications system.

Wireless communications system 100 may support efficient techniques for accommodating puncturing in a polar coding scheme. An encoder (housed within a communication component illustrated in FIG. 1) may identify (e.g., based on a target transmission rate and a bit channel capacity, as further explained below) a target mutual information for a transmission, and the encoder may polarize bit-channels based on the target mutual information. At each stage of polarization, a capacity of each bit-channel is determined based on bit-channel capacities of input bit-channels (e.g., from the previous stage of polarization and the mutual information transfer function). The resulting polarized bit-channels may then be partitioned into groups, each associated with a specific capacity (or mutual information) that corresponds to the aggregate reliability of the bit-channels in the group. The polarization of the bit-channels and the partitioning of the bit-channels into different groups may be done recursively until the number of bit locations allocated to a group of polarized bit-channels is below a certain threshold. The information bits may then be distributed to different polarized bit-channels based on the reliability metrics of the polarized bit-channels.

However, if a set of bits is punctured for the transmission, the initial capacity (or target mutual information) used to partition the unpolarized bit-channels into polarized bit-channels may be different. As described herein, an encoder may employ a polar coding scheme that adjusts the initial target mutual information based on the number of bits punctured for a transmission. Thus, the polarized bit-channels may be partitioned into groups associated with different reliability metrics (or different mutual information) based on the number of un-punctured bits. As such, the adjusted initial capacity (or number of un-punctured bits) may be distributed to the different groups of polarized bit-channels appropriately, and, the information bits of the transmission may be allocated to the most reliable polarized bit-channels.

Figure 2:
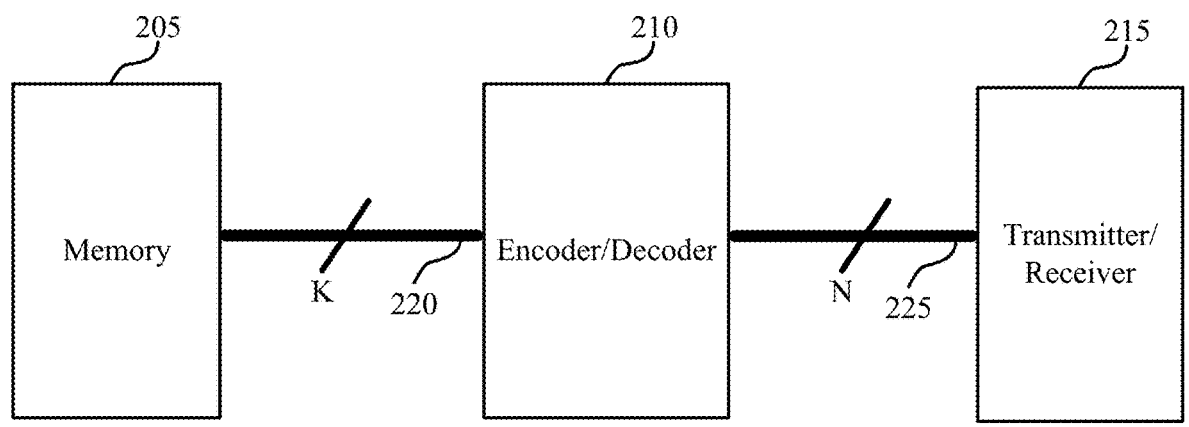
FIG. 2 illustrates an example of a device that supports a mutual-information based recursive polar code construction in accordance with various aspects of the present disclosure.

FIG. 2 illustrates an example of a device 200 that supports mutual-information based recursive polar code construction in accordance with various aspects of the present disclosure. Mutual information may relate to the relation and/or mutual dependence between separate variables and the measuring thereof. Recursive polar construction, as explained in more detail below, may refer to the recursively or repeatedly partitioning bit-channels of the polar code for each stage of polarization, and assigning portions of a number of information bits to bit-channel partitions of each stage of polarization based on a mutual information transfer function of respective aggregate capacities of the bit-channel partitions. Device 200 may include memory 205, encoder/decoder 210, and transmitter/receiver 215. Bus 220 may connect memory 205 and encoder/decoder 210, and bus 225 may connect encoder/decoder 210 and transmitter/receiver 215. In some instances, device 200 may have data stored in memory 205 to be transmitted to another device, such as, a UE 115 or a base station 105. To initiate data transmission, device 200 may retrieve the data, including information bits, from memory 205 for the transmission. The information bits included in memory 205 may be passed on to encoder/decoder 210 via bus 220. The number of information bits may be represented as a value k, as shown.

Encoder/decoder 210 may encode the k information bits and output a codeword having a length N, where k<N. Parity bits may be used in some forms of outer codes to provide redundancy to protect information bits, and frozen bits may be denoted by a given value (0, 1, etc.) known to both the encoder and the decoder (i.e., the encoder encoding information bits at a transmitter, and the decoder decoding the codeword received at a receiver). From a transmitting device perspective, device 200 may encode information bits to produce a codeword, and the codeword may be transmitted via transmitter 215. For a receiving device perspective, device 200 may receive encoded data (e.g., a codeword) via receiver 215 and may decode the encoded data using decoder 210 to obtain the information bits.

As mentioned above, device 200 may generate a codeword of length N and dimensionality k (corresponding to the number of information bits) using a polar code. A polar code is an example of a linear block error correcting code and is the first coding technique to provably achieve channel capacity. That is, polar codes may be used to increase the probability of a successful transmission. During encoding, a set of unpolarized bit-channels may be transformed into polarized bit-channels (e.g., channel instances or sub-channels) that may each be associated with a reliability metric. A reliability metric of a polarized bit-channel may approximate the ability of the polarized bit-channel to successfully convey an information bit to a receiver. Each polarized bit-channel may then be loaded with an information bit or non-information bit for a transmission based on the reliability metrics of different polarized bit-channels.

In some cases, reliability metrics may be determined based on a recursive partitioning of bit locations (e.g., channel instances or sub-channels) of the polar code. In a first polarization stage, a set of unpolarized bit-channels may be polarized, and the resulting polarized bit-channels may each be associated with a reliability metric determined based on the reliability metric (or mutual information) of the unpolarized bit-channels. The polarized bit-channels may then be partitioned into sectors or groups based on the determined reliability metrics of the different polarized bit-channels. For example, the bit-channels corresponding to the single parity check operation may be partitioned into a first, lower reliability group, while the bit-channels corresponding to a repetition operation may be partitioned into a second, higher reliability group. The polarization process may continue recursively until each partition reaches a given size.

A transmitting device may identify a number of information bits for a transmission (e.g., of an information bit vector), and the transmitting device may allocate or distribute the information bits to different groups of polarized bit-channels during the recursive partitioning based on a capacity of the different groups. Since the capacity of the different groups may be based on the reliability metric of different polarized bit-channels, subsets of the information bits may be distributed or allocated to different groups of polarized channels based on the reliability metrics associated with the different groups of polarized channels. The information bits may then be assigned to specific polarized bit-channels within a group based on a polarization metric (e.g., polarization weight, density evolution, etc.). Assigning information bits within each group may be based on a predetermined ranking of bit-channels within the groups. As such, the information bits may be loaded on the polarized bit-channels associated with the highest reliability metrics, and the remaining bits (e.g., parity bits and frozen bits) may be loaded on the remaining polarized bit-channels.

In some cases, however, the capacity of the unpolarized bit-channels may not be the same (e.g., due to puncturing). In such cases, if a polar code does not account for punctured bits, the information bits may not be allocated or distributed to the most favorable bit locations (i.e., bit location associated with the highest reliability). Accordingly, a wireless device may experience reduced throughput. Device 200 may support efficient techniques for facilitating puncturing in a polar coding scheme. Specifically, the recursive partitioning of bit-channels into polarized bit-channels may be based on the overall capacity for a transmission adjusted based on the number of bits punctured. The capacity of different sectors and groups of polarized bit-channels may thus be altered according to the adjusted polarized bit capacity, and a device may be able to allocate or distribute information bits to the most favorable bit locations.

Figure 3:
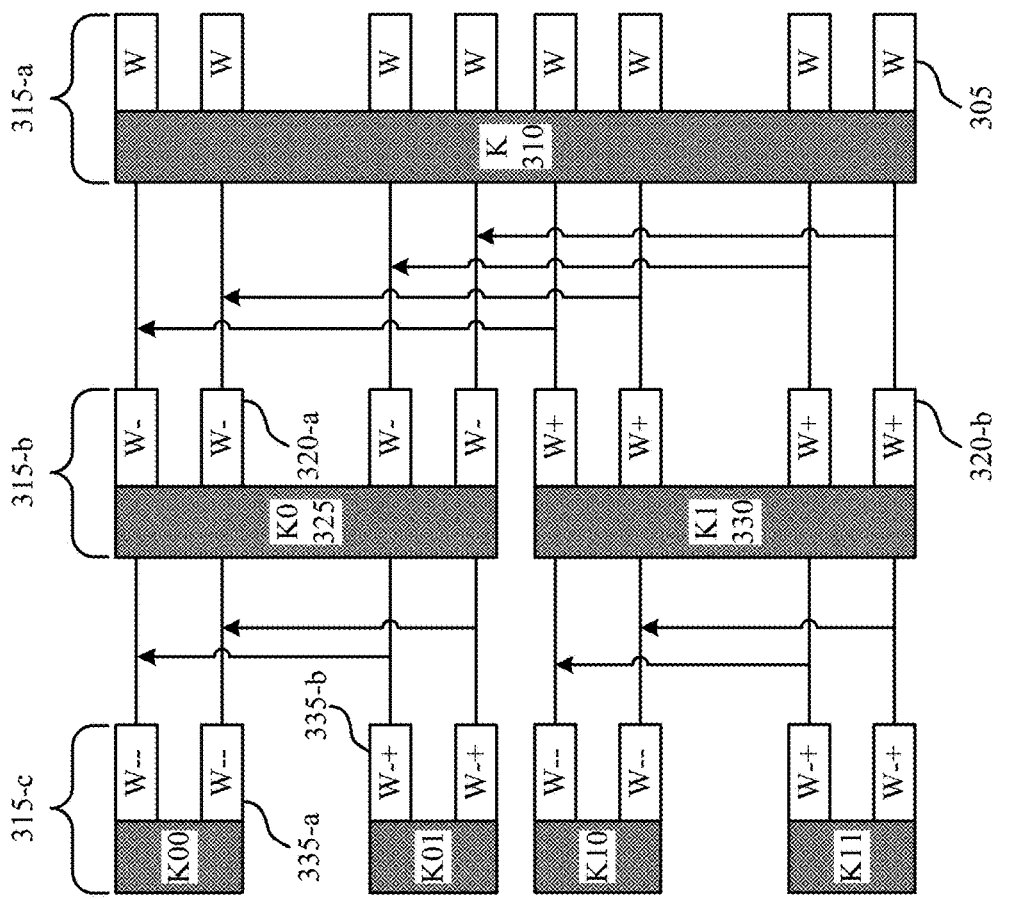
FIGS. 3-8 illustrate examples of a polar coding scheme that supports a mutual-information based recursive polar code construction in accordance with various aspects of the present disclosure.
Figure 3:
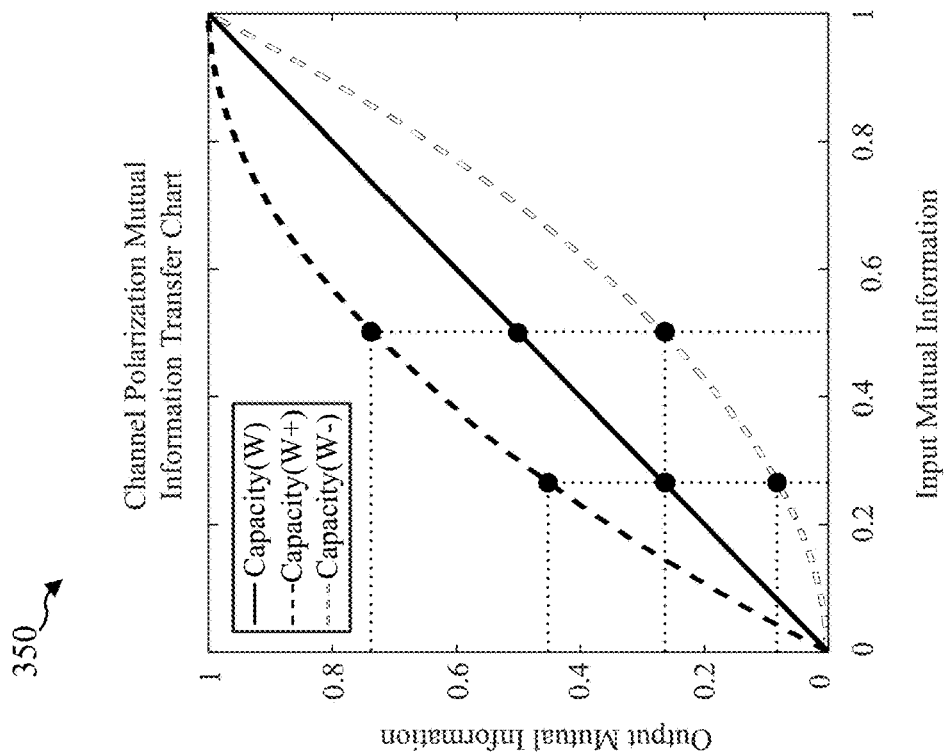

FIG. 3 illustrates an example of a polar coding scheme 300 that supports a mutual-information based recursive polar code construction in accordance with various aspects of the present disclosure. In some cases, a transmitting device (e.g., a base station or a UE) may identify information for a transmission to a receiving device over a channel 'W'. In some examples, the polar coding scheme 300 may be used to generate eight (8) coded bits for the transmission (e.g., four (4) information bits 310 (i.e., K=4) and four (4) parity and frozen bits). As shown in polar coding scheme 300, an encoding process would proceed from left to right, while polarization may be understood as occurring in polarization stages proceeding from right to left.

To ensure that the information bits transmitted by the transmitting device can be decoded by the receiving device, the transmitting device may transmit the information bits on channel instances (or sub-channels) of the channel 'W' associated with the highest reliability. In some cases, the transmitting device may identify a target mutual information (or code rate) for a transmission, and the transmitting device may use this information to encode the information bits for the transmission. In the present example, the target mutual information (or code rate) may be calculated as the number of information bits divided by the capacity of a group of bit-channels at a specific encoding stage (e.g., encoding stage 315-a). As can be seen in equation 1 below, the capacity of each bit-channel at the first encoding stage 315-a corresponds to the overall capacity of the transmission.

$$\text{Target Mutual Information} = \text{Code rate} = \frac{K}{2^m} \quad (1)$$

Where m=log 2(N) if N is the code length without puncturing. Based on the target mutual information (or code rate), the transmitting device may partition the unpolarized bit-channels 305 into groups of polarized bit-channels 320a and 320-b.

Specifically, the transmitting device may determine the mutual information or capacity of the polarized bit-channels based on mapping the target mutual information to a channel polarization mutual information transfer function, such as a function corresponding to the channel polarization mutual information transfer chart 350. Furthermore, the transmitting device may allocate or distribute information bits to the different polarized bit-channels based on the mutual information or capacity of the polarized bit-channels. As illustrated, the number of polarized bit-channels 320-a in each partitioned group for each polarization stage is the same. As shown in the channel polarization mutual information transfer chart, the mutual information or capacity of the polarized bit-channels 320-b may be greater than or equal to the mutual information or capacity of the polarized bit-channels 320-a, and the sum of the capacity of the polarized bit-channels 320-a and 320-b may be equal to the sum of the capacity of the unpolarized bit-channels 305.

$$\text{Capacity}(W+) \geq \text{Capacity}(W-) \quad (2)$$

$$\text{Capacity}(W+) + \text{Capacity}(W-) = 2*\text{Capacity}(W) \quad (3)$$

Thus, the transmitting device may allocate or distribute more information bits to polarized bit-channels 320-b than to polarized bit-channels 320-a. The transmitting device may identify the distribution of the information bits between the polarized bit-channels 320a and 320-b based on the following equations:

$$K0 + K1 = K \quad (4)$$

$$\frac{K0}{K1} = \frac{Cap(W-)}{Cap(W+)} \quad (5)$$

where K0 corresponds to the number of information bits (or bit locations) allocated or distributed to polarized bit-channels 320-*a*, and K1 corresponds to the number of information bits (or bit locations) allocated or distributed to polarized bit-channels 320-*b*.

In the example introduced above where K=4 and m=3, each of the unpolarized bit-channels 305 may have a capacity of 0.5 which, based on the channel polarization mutual information transfer chart 350, gives a mutual information for the polarized bit-channels 320-*b* of approximately 0.75 and a mutual information of the polarized bit-channels 320-*a* of approximately 0.25. Since mutual information corresponds to the capacity of the polarized bit-channels 320-*a* and 320-*b*, the transmitting device may allocate or distribute three (3) bits to polarized bit-channels 320-*b* (i.e., K1=3) and one (1) bit to polarized bit-channels 320-*a* (i.e., K0=1). Thus, the resulting mutual information of the group of polarized bit-channels 320-*a* corresponds to the following equation:

$$\text{Mutual Information} = \frac{K0}{2^{m-1}} = \quad (6)$$

Similarly, the resulting mutual information of the group of polarized bit-channels 320-*b* corresponds to the following equation:

$$\text{Mutual Information} = \frac{K1}{2^{m-1}} = \quad (7)$$

As illustrated, the transmitting device may then recursively partition the polarized bit-channels into groups of further polarized bit-channels based on the capacity of different partitions to identify the bit-channels with the highest reliabilities. The transmitting device may distribute or allocate the information bits to these further polarized bit-channels (i.e., assign bit locations) based on the mutual information (or reliability) of the polarized bit-channels. As an example, polarized bit-channels 320-*a* may be further polarized into polarized bit-channels 335-*a*. The transmitting device may identify the mutual information of polarized bit-channels 320-*a* and use this information to partition these bit-channels into further polarized bit-channels 335-*a*. As discussed above, in the present example, the mutual information of polarized bit-channels 320-*a* may be 0.25 while the mutual information of polarized bit-channels 320-*b* may be 075.

Based on the mutual information, the transmitting device may partition the polarized bit-channels 320-*a* into groups of polarized bit-channels 335-*a* using the same techniques described above. The example provided is simplified for ease of illustration and the techniques described herein may generally be applied to cases where the codeword length 'N' is above a specific threshold (e.g., 32, 64, etc.). These techniques may be repeated recursively until the block size of a group of polarized bit-channels is below a certain threshold. An encoder may then assign a number of information bits to each group based on the reliability of the polarized bit-channels within a group.

For example, if the size of a block is less than or equal to the threshold, then a sequence may be used to determine the distribution of the allocated information bits within the group. The sequence may be derived by applying a polarization weight or by using density evolution techniques (e.g., with a pre-calculated sequence). Accordingly, the bit locations of the information bits may be chosen to ensure that a receiving device can repeat the process used to determine the information bit locations. A receiving device may receive the transmission and may use similar techniques to identify the bit locations of the transmission by partitioning unpolarized bit-channels into polarized bit-channels recursively.

In some cases, however, the number of bits generated by the polar code may exceed the number of bits to be transmitted. For example, the transmitting device may puncture some bits of the encoded bits prior to transmitting the bits to a receiving device. A punctured bit may be a bit for which no information is transmitted (e.g., the bit is skipped), or a bit that is used for another purpose (e.g., transmission of a reference signal, etc.). Puncturing may include, for example, shortening puncturing (or known bit puncturing), or other puncturing. To facilitate puncturing, the transmitting device may adjust the polar coding scheme based on the number of bits punctured for a transmission.

Figure 4:
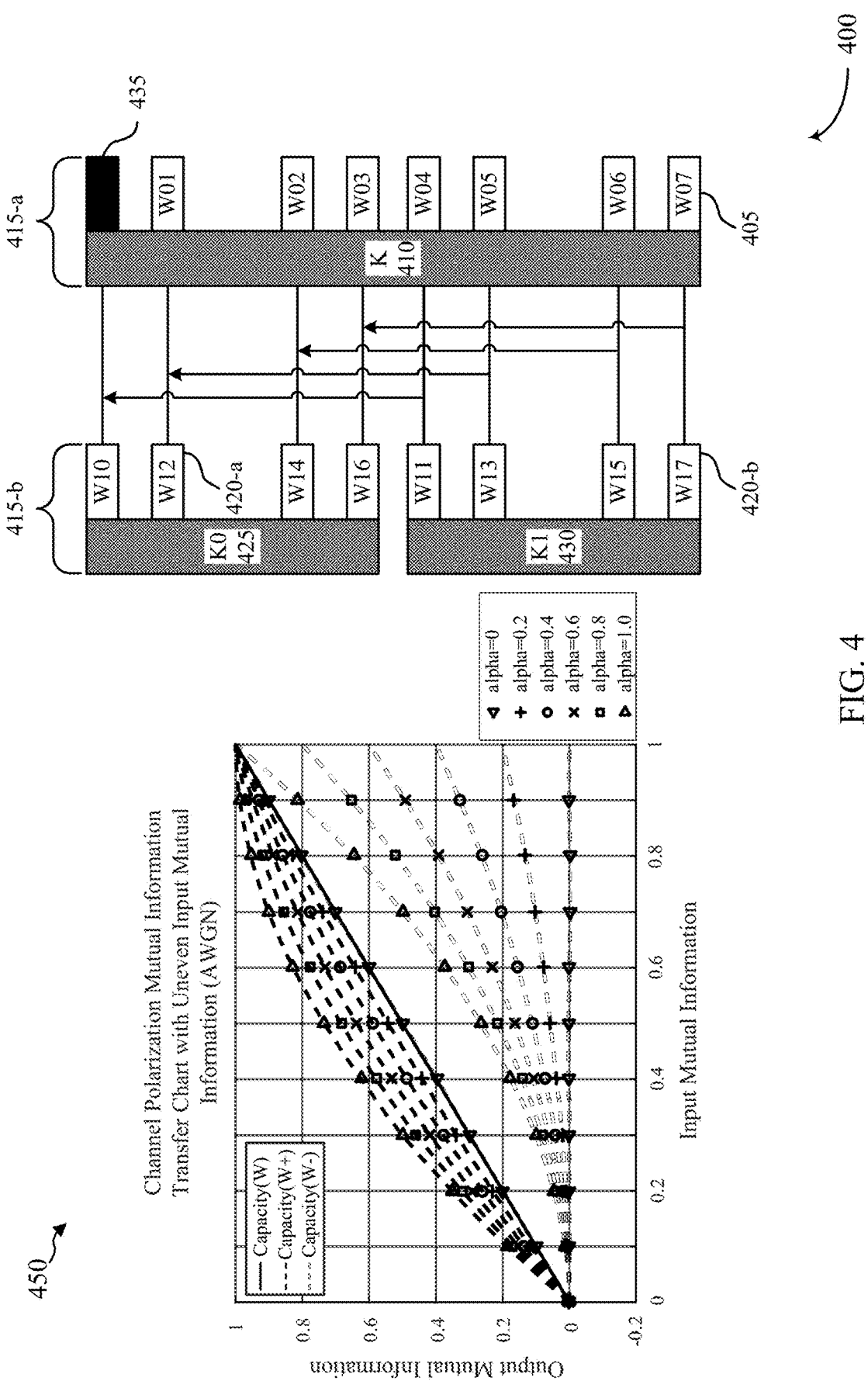

FIG. 4 illustrates an example of a polar coding scheme 400 that supports a mutual-information based recursive polar code construction in accordance with various aspects of the present disclosure. In some cases, a transmitting device (e.g., a base station or a UE) may identify information for a transmission to a receiving device over a channel 'W'. In some examples, the polar coding scheme 400 may be used to generate eight (8) coded bits for the transmission (e.g., four (4) information bits 410 (i.e., K=4) and four (4) parity and frozen bits). The transmitting device may identify that a portion of bits (e.g., bit 435) may be punctured for the transmission (e.g., unknown bit puncturing), and the transmitting device may adjust polar coding scheme 400 based on the number of punctured bits.

To increase robustness of transmission for the information bits, the transmitting device may transmit the information bits on channel instances (or sub-channels) corresponding to the channels associated with the highest reliability. In some cases, the transmitting device may identify a target mutual information (or code rate) for a transmission, and the transmitting device may use this information to encode the information bits for the transmission. The target mutual information (or code rate) for the transmission may be adjusted to account for the puncturing. Specifically, in the present example, the mutual information of the punctured bit 435 may be set to zero (0), and the target mutual information (or code rate) may be calculated as the number of information bits divided by the capacity of a group at a corresponding encoding stage of a transmission (e.g., encoding stage 415-*a*). As can be seen in equation 8 below, the capacity of the unpolarized bit-channels at a first encoding stage 415-*a* corresponds to the difference between the overall capacity of the transmission and the number of punctured bits denoted as M (i.e., the number of un-punctured bits).

$$\text{Target Mutual Information} = \text{Code rate} = \frac{K}{2^m - M} \quad (8)$$

Based on the target mutual information (or code rate), the transmitting device may partition the unpolarized bit-channels 405 into groups of polarized bit-channels 420.

Specifically, the transmitting device may determine the mutual information or capacity of the polarized bit-channels based on mapping the target mutual information to a channel polarization mutual information transfer function, such as a function corresponding to the channel polarization mutual information transfer chart 450. Furthermore, the transmitting device may allocate or distribute information bits to the different polarized bit-channels based on the mutual information or capacity of the polarized bit-channels. As illustrated in the channel polarization mutual information transfer chart, the mutual information or capacity of each of the polarized bit-channels 420-$b$ is greater than or equal to the capacity of corresponding ones of the polarized bit-channels 420-$a$, and the sum of the capacity of the polarized bit-channels may be equal to the sum of the capacity of the unpolarized bit-channels. The capacity of non-shortening based punctured bits may be set to zero.

$$\text{Capacity}(W+) \geqslant \text{Capacity}(W-) \tag{9}$$

$$\begin{aligned} C(W10)+C(W12)+C(W14)+C(W16)+C(W11)+C \\ (W13)+C(W15)+C(W17)=0+C(W01)+C(W02)+C \\ (W03)+C(W04)+C(W05)+C(W06)+C(W07) \end{aligned} \tag{10}$$

In some examples, C(W10) may equal 0.

Thus, the transmitting device may allocate or distribute information bits to polarized bit-channels 420-$b$ and polarized bit-channels 420-$a$ in proportion to their capacities. The transmitting device may identify the distribution of the information bits between the polarized bit-channels 420 based on the following equations:

$$K0 + K1 = K \tag{11}$$

$$\frac{K0}{K1} = \frac{C(W10) + C(W12) + C(W14) + C(W16)}{C(W11) + C(W13) + C(W15) + C(W17)} \tag{12}$$

Mutual information transfer chart 450 shows the capacity for the W+ and W− bit-channels where the capacity of the input bit-channels may be different. For a given set of two (2) capacity (or mutual information) values input on single parity check and partition input bit-channels, the capacity for mutual information transfer chart 450 will be the larger of the two values, and an alpha value may correspond to a ratio between the two values. Thus, the capacity of one input bit-channel may be a normalized common capacity and the capacity of another input bit-channel may be the normalized capacity scaled by the alpha value.

These techniques may be repeated recursively until the block size of a group of polarized bit-channels is below a certain threshold (e.g., 32, 64, or 128 bit-channels, etc.). For example, if the size of a nested polar code is less than or equal to the threshold, then a reliability ranking calculation (e.g., polarization weight) or pre-calculated ranking may be used to determine the distribution of the allocated information bits (i.e., the bit locations) within a group. The pre-calculated ranking may be derived by applying a polarization weight or by using density evolution techniques. Accordingly, the bit locations of the information bits may be chosen in a manner that can be repeated by a receiving device. A receiving device may receive the transmission and may perform similar techniques to identify the bit locations of the transmission by partitioning unpolarized bit-channels into polarized bit-channels recursively.

Figure 5:
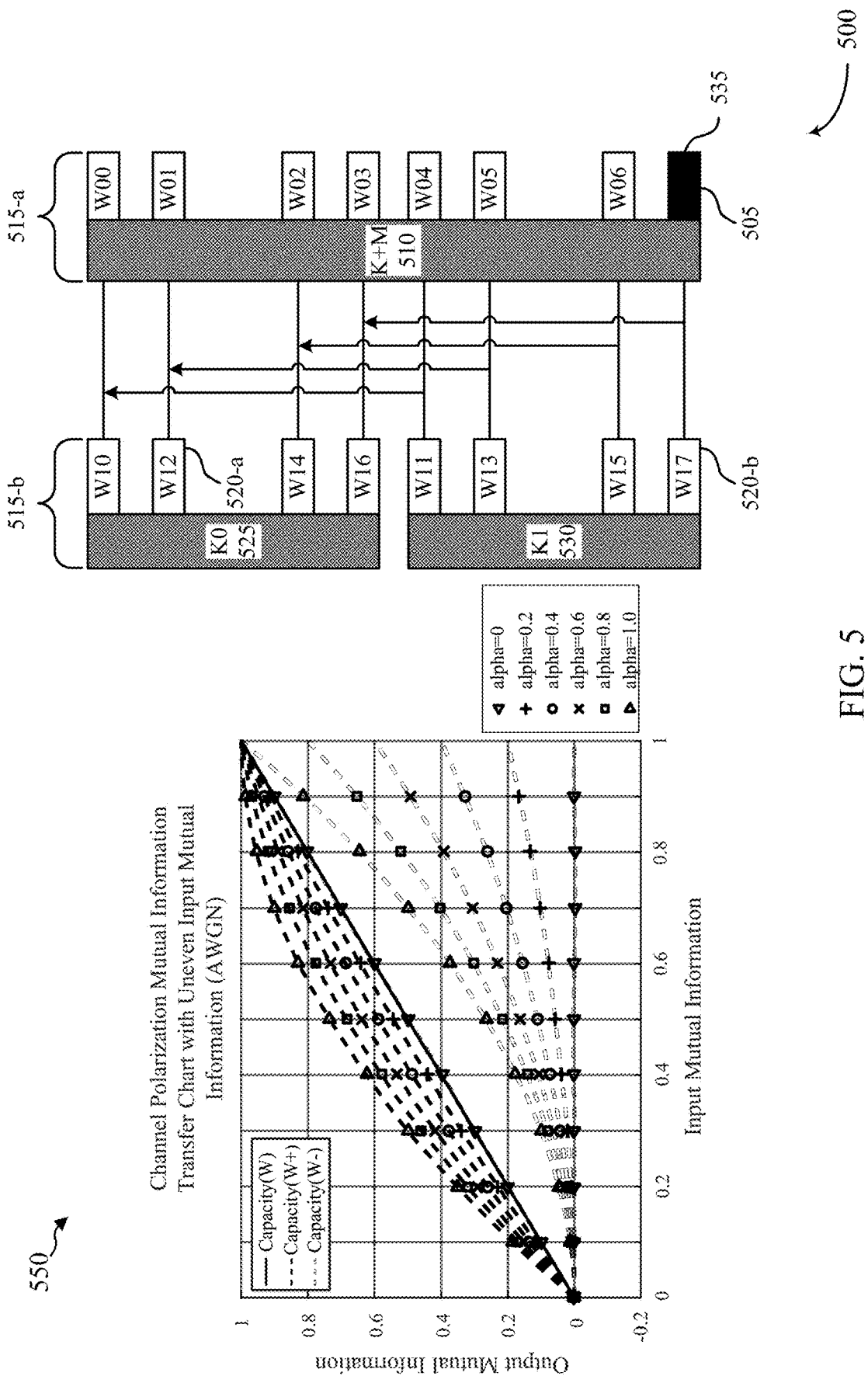

FIG. 5 illustrates an example of a polar coding scheme 500 that supports a mutual-information based recursive polar code construction in accordance with various aspects of the present disclosure. In some cases, a transmitting device (e.g., a base station or a UE) may identify information for a transmission to a receiving device over a channel 'W'. In some examples, the polar coding scheme 500 may be used to generate eight (8) coded bits for the transmission (e.g., four (4) information bits 510 (i.e., K=4) and four (4) parity and frozen bits). The transmitting device may identify that a portion of bits (e.g., bit 535) may be punctured for the transmission (e.g., known bit puncturing), and the transmitting device may adjust polar coding scheme 500 based on the number of punctured bits.

To increase robustness of transmission for the information bits transmitted by the transmitting device can be decoded by the receiving device, the transmitting device may transmit the information bits on channel instances (or sub-channels) corresponding to the channels associated with the highest reliability. In some cases, the transmitting device may identify a target mutual information (or code rate) for a transmission, and the transmitting device may use this information to encode the information bits for the transmission. The target mutual information (or code rate) for the transmission may be adjusted to account for the puncturing. Specifically, in the present example, the mutual information of the punctured bit 535 may be set to one, and the target mutual information (or code rate) may be calculated as the number of information bits divided by the capacity of a group of polarized bits at a corresponding encoding stage of a transmission (e.g., encoding stage 515-$a$). As can be seen in equation 13 below, the capacity of the unpolarized bit-channels at a first encoding stage 515-$a$ corresponds to the difference between the overall capacity of the transmission and the number of punctured bits denoted as M (i.e., the number of un-punctured bits).

$$\text{Target Mutual Information} = \text{Code rate} = \frac{K}{2^m - M} \tag{13}$$

Based on the target mutual information (or code rate), the transmitting device may partition the unpolarized bit-channels 505 into groups of polarized bit-channels 520-$a$ and 520-$b$.

Specifically, the transmitting device may determine the mutual information or capacity of the polarized bit-channels based on mapping the target mutual information to a channel polarization mutual information transfer function, such as a function corresponding to the channel polarization mutual information transfer chart 550. Furthermore, the transmitting device may allocate or distribute information bits to the different polarized bit-channels based on the mutual information or capacity of the polarized bit-channels. As illustrated in the channel polarization mutual information transfer chart, the mutual information or capacity of each of the polarized bit-channels 520-$b$ is greater than or equal to the capacity of corresponding ones of the polarized bit-channels 520-$a$, and the sum of the capacity of the polarized bit-channels may be equal to the sum of the capacity of the unpolarized bit-channels. The capacity of shortening based punctured bits may be set to unity (a capacity value of 1).

$$\text{Capacity}(W+) \geqslant \text{Capacity}(W-) \tag{14}$$

$$\begin{aligned} C(W10)+C(W12)+C(W14)+C(W16)+C(W11)+C \\ (W13)+C(W15)+C(W17)=C(W00)+C(W01)+C \\ (W02)+C(W03)+C(W04)+C(W05)+C(W06)+1 \end{aligned} \tag{15}$$

In some examples, C(W10) may equal 1.

Thus, the transmitting device may allocate or distribute information bits to polarized bit-channels 520-$b$ and polarized bit-channels 520-$a$ in proportion to their capacities. The transmitting device may identify the distribution of the information bits between the polarized bit-channels 520-$a$ and 520-$b$ based on the following equations:

$$K0 + K1 = K + M \quad (16)$$

$$\frac{K0}{K1} = \frac{C(W10) + C(W12) + C(W14) + C(W16)}{C(W11) + C(W13) + C(W15) + C(W17)} \quad (17)$$

For a given set of two (2) capacity (or mutual information) values input on a single parity check and partition input bit-channels, the normalized capacity will be the larger of the two values, and an alpha value may correspond to a ratio between the two values. Thus, the capacity of one bit-channel may be a normalized capacity and the capacity of another bit-channel may be the normalized capacity scaled by the alpha value.

These techniques may be repeated recursively until the block size of a group of polarized bit-channels is below a certain threshold. For example, if the size of a nested polar code is less than or equal to the threshold, then a reliability ranking calculation (e.g., polarization weight) or pre-calculated ranking may be used to determine the distribution of the allocated information bits (i.e., the bit locations) within a group. The pre-calculated ranking may be derived by applying a polarization weight or by using density evolution techniques. Accordingly, the bit locations of the information bits may be chosen in a manner that can be repeated by a receiving device. A receiving device may receive the transmission and may perform similar techniques to identify the bit locations of the transmission by partitioning unpolarized bit-channels into polarized bit-channels recursively.

Figure 6:
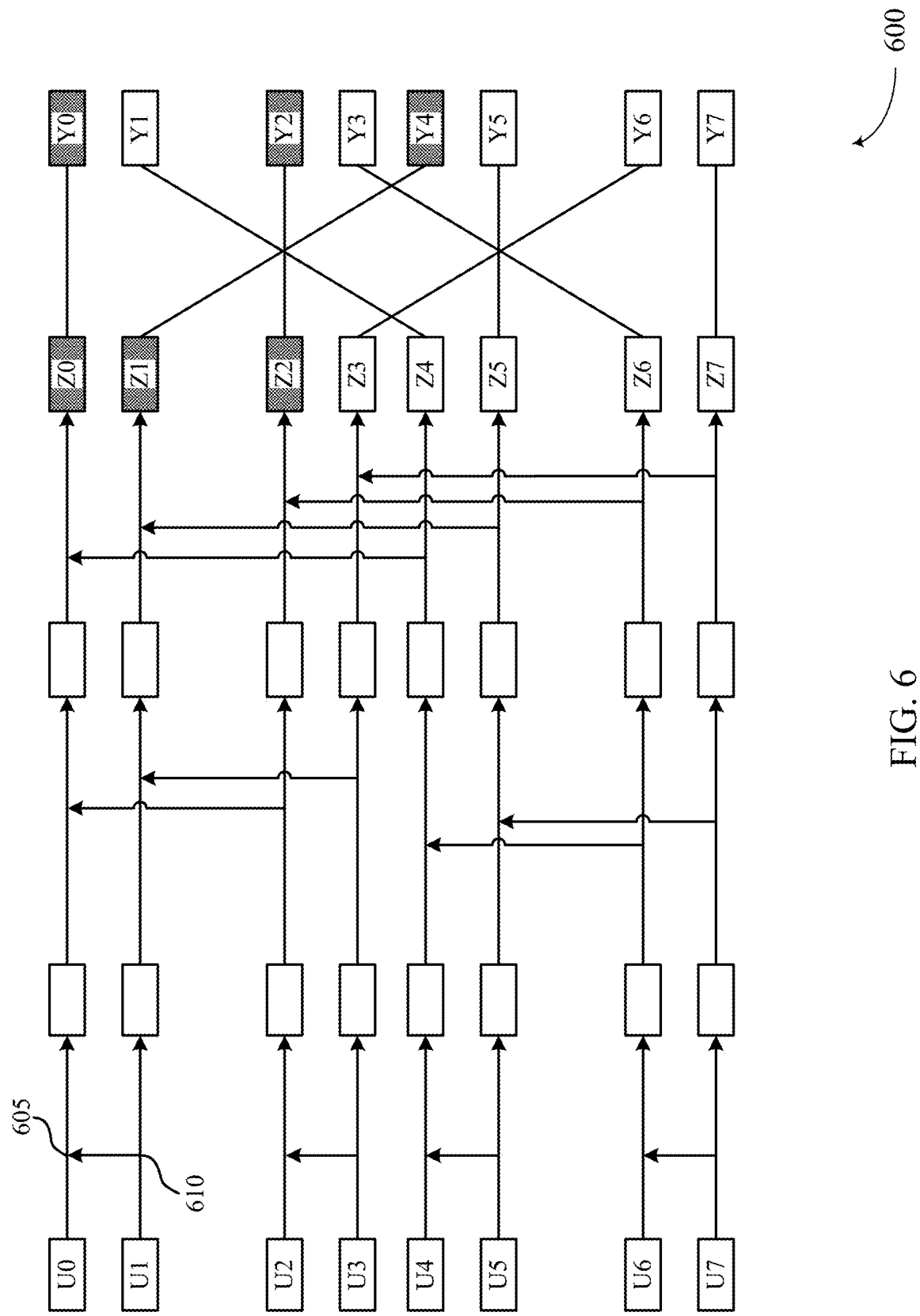

FIG. 6 illustrates an example of a polar coding scheme 600 that supports a mutual-information based recursive polar code construction in accordance with various aspects of the present disclosure. An encoder at a transmitting device may receive an input vector (U) with a set of bits (e.g., U0, U1, U2, U3, U4, U5, U6, and U7), including information bits, frozen bits, and/or parity bits. The set of bits may be encoded in a codeword Z using a polar code encoding algorithm implemented by the encoder. The polar code encoding algorithm may be implemented by a plurality of operations, including, for example, exclusive OR (XOR) operations 605 performed where the upper ends of vertical arrow segments intersect horizontal arrow segments, and repetition operations 610 performed where the lower ends of vertical arrow segments intersect horizontal arrow segments. Each XOR operation 605 and repetition operation 610 may generate an output, and the XOR operations 605 and repetition operations 610 may be performed on a number of interconnected bit-channels to generate the codeword Z.

The codeword Z includes a set of bits (e.g., Z0, Z1, Z2, Z3, Z4, Z5, Z6, and Z7) that may be transmitted over a physical channel. Codeword Y may include bits Y0, Y1, Y2, Y3, Y4, Y5, Y6, and Y7, which may be in a bit-reversed order compared to the bits of the codeword Z. The transmitter may transmit codeword Z (non-bit-reversed) or codeword Y (bit-reversed). In some cases, the codewords Y or Z may be punctured in accordance with a non-shortening puncturing scheme before the bits are transmitted. Unknown bit puncturing is one form of non-shortening puncturing, and involves refraining from transmitting a set of least significant bits (LSBs) of the codeword Z (e.g., LSBs Z0, Z1, and Z2). The set of LSBs that are punctured are bits of the codeword Z that are dependent on the computation of other bits of the codeword Z. As illustrated, the puncture of a contiguous set of three (3) LSBs of codeword Z results in a puncture of a non-contiguous set of bits in codeword Y. Block puncturing may refer to puncturing of a contiguous set of bit locations in codeword Z. Polar coding scheme 700 may implement similar techniques to those described with reference to FIG. 4 to accommodate puncturing in the encoding process.

Figure 7:
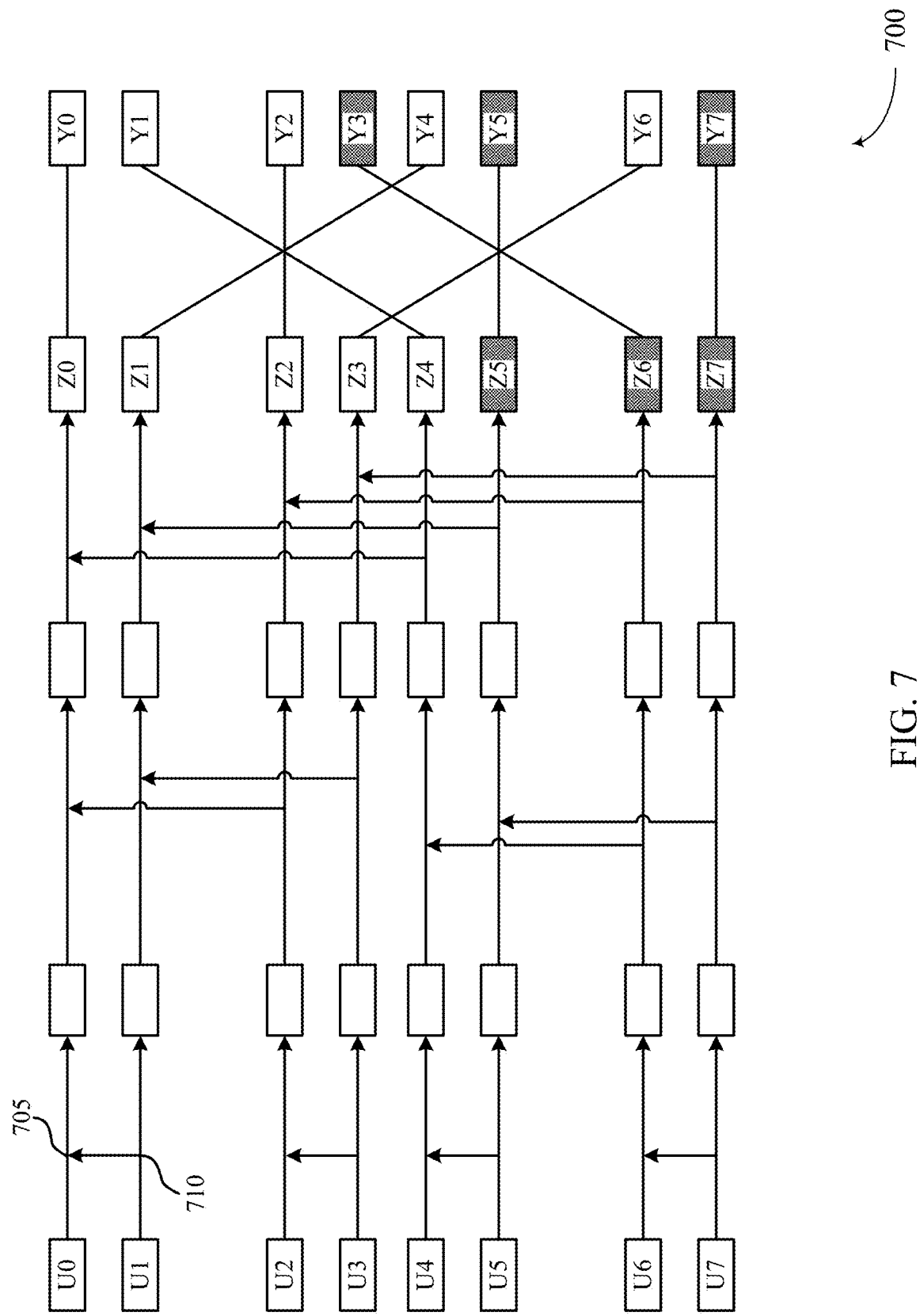

FIG. 7 illustrates an example of a polar coding scheme 700 that supports a mutual-information based recursive polar code construction in accordance with various aspects of the present disclosure. An encoder at a transmitting device may receive an input vector (U) with a set of bits (e.g., U0, U1, U2, U3, U4, U5, U6, and U7) including information bits, frozen bits, and/or parity bits. The set of bits may be encoded in a codeword Z using a polar code encoding algorithm implemented by the encoder. The polar code encoding algorithm may be implemented by a plurality of operations, including, for example, XOR operations 705 performed where the upper ends of vertical arrow segments intersect horizontal arrow segments, and repetition operations 710 performed where the lower ends of vertical arrow segments intersect horizontal arrow segments. Each XOR operation 705 and repetition operation 710 may generate an output, and the XOR operations 705 and repetition operations 710 may be performed on a number of interconnected bit-channels to generate the codeword Z.

The codeword Z includes a set of bits (e.g., Z0, Z1, Z2, Z3, Z4, Z5, Z6, and Z7) that may be transmitted over a physical channel. Codeword Y may include bits Y0, Y1, Y2, Y3, Y4, Y5, Y6, and Y7, which may be in a bit-reversed order compared to the bits of the codeword Z. The transmitter may transmit codeword Z (non-bit-reversed) or codeword Y (bit-reversed). In some cases, the codewords Y or Z may be punctured in accordance with a shortening puncturing scheme before the bits are transmitted. In the present example, shortening (or known bit puncturing) may include the puncturing of a set of MSBs of the codeword Z and zeroing of corresponding locations in U with the same indices. In some examples, zeroing may be equivalent to any known bit value (e.g., a logic 0 or a logic 1). As illustrated, the puncturing of a contiguous set of three (3) MSBs of codeword Z results in the puncturing of a non-contiguous set of bits in codeword Y. This type of puncturing may be referred to as natural order shortening. Polar coding scheme 700 may implement similar techniques to those described with reference to FIG. 5 to accommodate puncturing in the encoding process.

Figure 8:
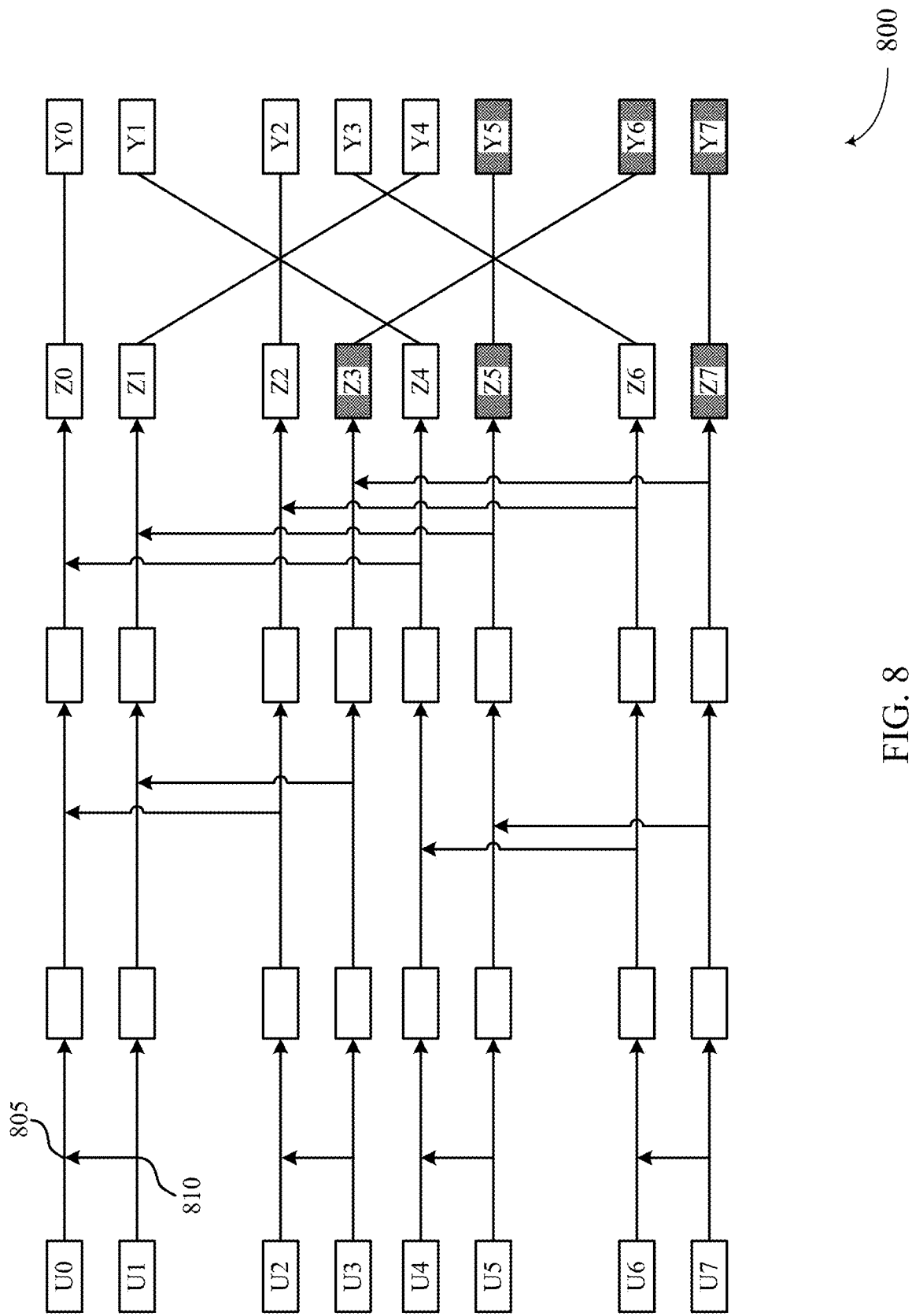

FIG. 8 illustrates an example of a polar coding scheme 800 that supports a mutual-information based recursive polar code construction in accordance with various aspects of the present disclosure. An encoder at a transmitting device may receive an input vector (U) with a set of bits (e.g., U0, U1, U2, U3, U4, U5, U6, and U7) including information bits, frozen bits, and/or parity bits. The set of bits may be encoded in a codeword Z using a polar code encoding algorithm implemented by the encoder. The polar code encoding algorithm may be implemented by a plurality of operations, including, for example, XOR operations 805 performed where the upper ends of vertical arrow segments intersect horizontal arrow segments, and repetition operations 810 performed where the lower ends of vertical arrow segments intersect horizontal arrow segments. Each XOR operation 805 and repetition operation 810 may generate an output, and the XOR operations 805 and repetition operations 810 may be performed on a number of interconnected bit-channels to generate the codeword Z.

The codeword Z includes a set of bits (e.g., Z0, Z1, Z2, Z3, Z4, Z5, Z6, and Z7) that may be transmitted over a physical channel. Codeword Y includes bits Y0, Y1, Y2, Y3, Y4, Y5, Y6, and Y7, which may be in a bit-reversed order compared to the bits of the codeword Z. The transmitter may transmit codeword Z (non-bit-reversed) or codeword Y (bit-reversed). In some cases, the codewords Y or Z may be punctured in accordance with a shortening puncturing scheme before the bits are transmitted. In the present example, shortening (or known bit puncturing) may include the puncturing of a set of MSBs of the codeword Y and zeroing of corresponding locations in U with the indices that are bit-reversed compared to the bit locations zeroed in codeword Y. In some examples, zeroing may be equivalent to any known bit value (e.g., a logic 0 or a logic 1). As illustrated, the puncturing of a contiguous set of three (3) MSBs of codeword Y results in the puncturing of a non-contiguous set of bits in codeword Z. This type of puncturing may be referred to as bit-reversed order shortening. Polar coding scheme 800 may implement similar techniques to those described with reference to FIG. 5 to accommodate puncturing in the encoding process.

Figure 9:
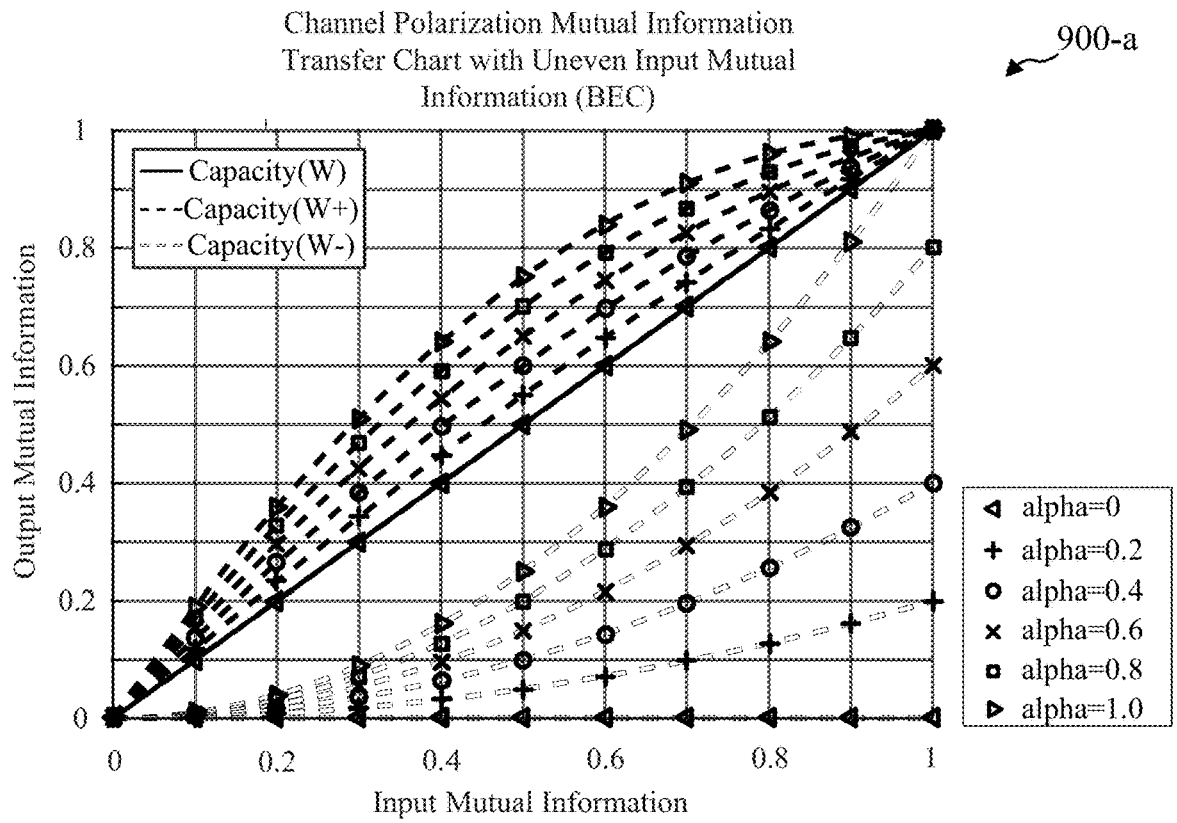
FIG. 9 illustrates an example of a channel polarization mutual information transfer function that supports mutual-information based recursive polar code construction in accordance with various aspects of the present disclosure.
Figure 9:
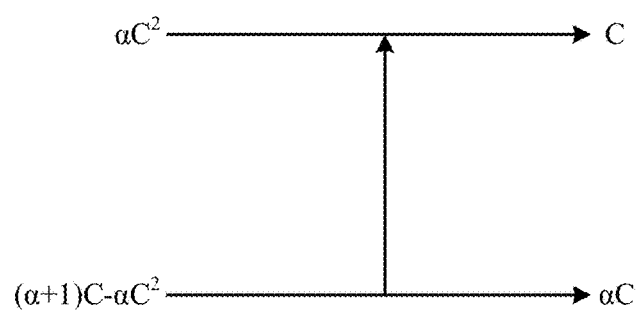

FIG. 9 illustrates an example of a channel polarization mutual information transfer function that supports mutual-information based recursive polar code construction in accordance with various aspects of the present disclosure. The mutual information transfer function may be used to derive channel polarization mutual information transfer chart with uneven input mutual information 900-*a*. As described with reference to FIGS. 3-5, the channel polarization mutual information transfer function may be used to determine the mutual information of polarized bit-channels (e.g., polarized bit-channels W+ and W−) based on the mutual information of a bit-channel 'W.' Similarly, the channel polarization mutual information transfer function may be used to recursively determine the mutual information of polarized bit-channels. In some cases, however, the computational complexity associated with a mutual information transfer function (e.g., such as those described with reference to FIGS. 4 and 5) may be high, which may be detrimental to implementations at a UE. Thus, less computationally complex mutual information transfer functions may be desirable.

Mutual information transfer function may be less computationally complex than other mutual information transfer functions (e.g., such as those described with reference to FIGS. 4 and 5). Mutual information transfer function may be derived based on a BEC, whereas other mutual information transfer functions may be derived based on an additive white Gaussian noise (AWGN) channel. Computation 900-*b* is associated with mutual information transfer chart 900-*a* and shows the relationship between the BEC capacity of input bit-channels and the BEC capacity of output polarized bit-channels. Computation 900-*b* illustrates the simplicity of the computation used to derive the capacity of polarized bit-channels as compared to computations associated with other mutual information transfer functions. In some cases, however, the mutual information transfer function described in the present example may not align with other mutual information transfer functions derived based on an AWGN channel.

Figure 10A:
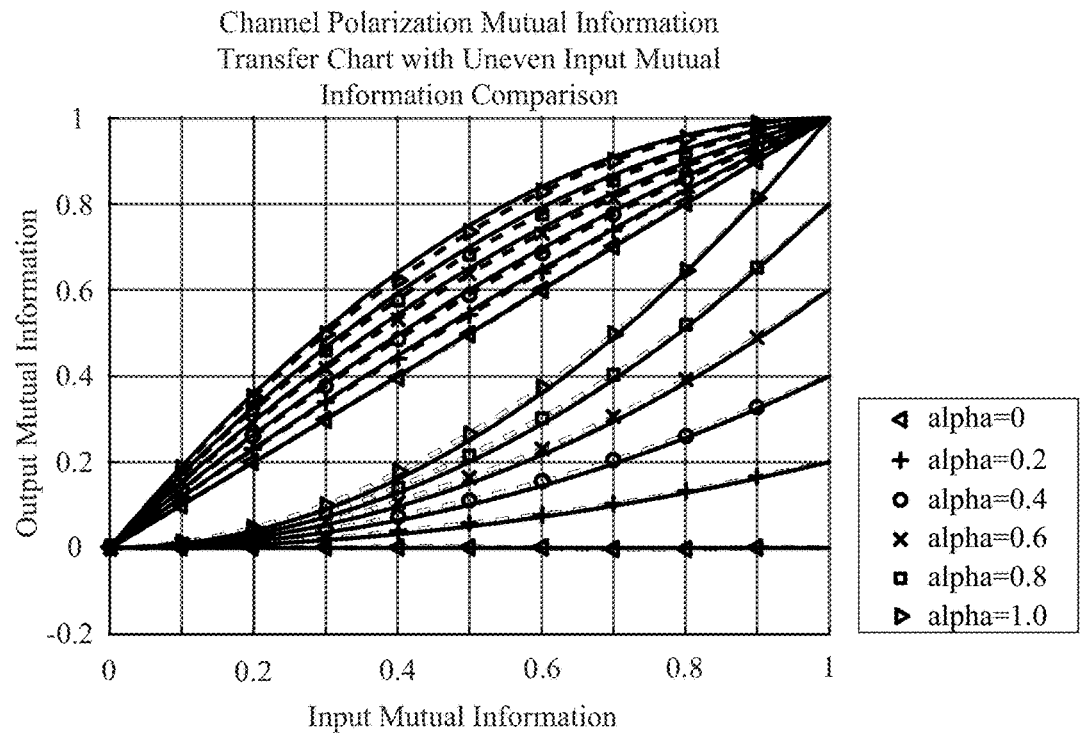
FIGS. 10A and 10B illustrate examples of a channel polarization mutual information transfer function comparison and correction that supports mutual-information based recursive polar code construction in accordance with various aspects of the present disclosure.
Figure 10B:
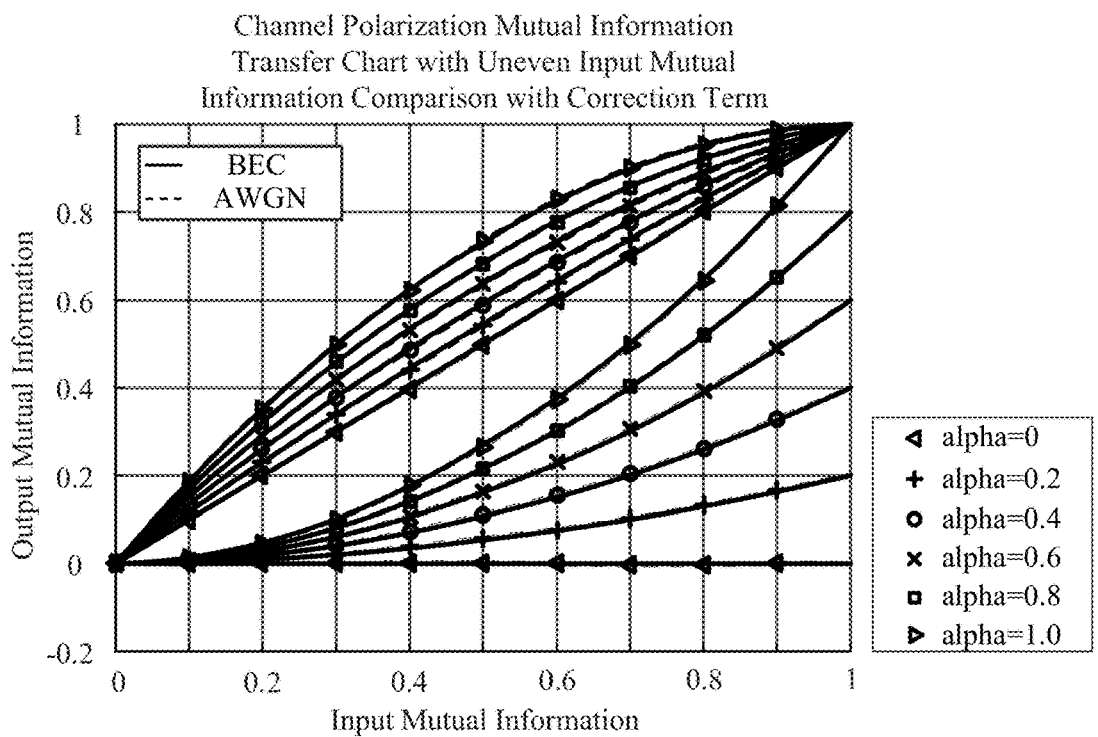

FIGS. 10A and 10B illustrate examples of a channel polarization mutual information transfer function comparison and correction 1000 that supports mutual-information based recursive polar code construction in accordance with various aspects of the present disclosure. As illustrated in mutual information transfer chart 1000-*a*, the mutual information transfer chart derived based on a BEC does not align with the mutual information transfer chart derived based on a AWGN channel. Accordingly, an encoder may apply a correction term to the mutual information transfer function derived based on the BEC to align the functions. Specifically, the output capacity of the mutual information transfer function derived based on the BEC $$\text{Output Capacity} = (\alpha+1)C - \alpha C^2 \quad (18)$$

may be adjusted by a correction term to align the graphs to give $$\text{Output Capacity} = (\alpha+1)C - \alpha C^2 - \delta \quad (19)$$

where $$\delta = (F1 e^{F2} * \text{abs}(C+F3) + F4 e^{F5}) * \alpha \quad (20)$$

corresponds to an example of the correction term, and C corresponds to a capacity of a bit-channel or mutual information associated with a bit-channel. In some examples, the factors in the equation above may be defined as follows: F1=−4, F2=−2, F3=−0.5, F4=2, and F5=−2.

Figure 11:
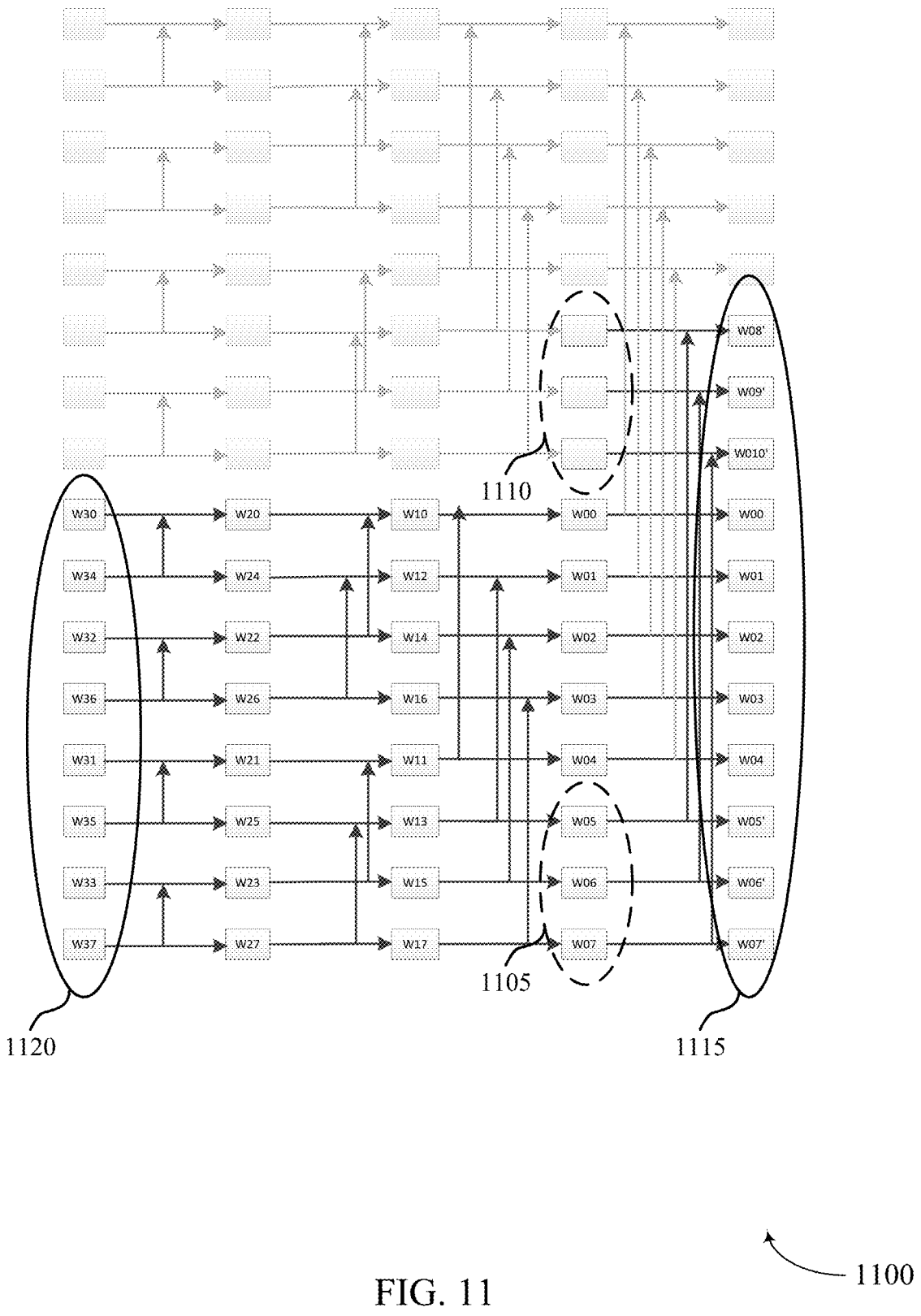
FIG. 11 illustrates an example of a polar coding scheme that employs bit repetition in accordance with various aspects of the present disclosure.

FIG. 11 illustrates an example of a polar coding scheme 1100 that employs bit repetition in accordance with various aspects of the present disclosure. Bit repetition may extend the length of a codeword. For example, in a codeword including eight (8) coded bits, a most significant bit portion 1105 of the codeword (e.g., three (3) coded bits) may be repeated in a set of repeated bit locations 1110. In some examples, the set of repeated bit locations 1110 may be provided by extending the length of the polar code used for the encoding (e.g., doubling the length of the polar code, from length x to length 2x (e.g., from eight (8) bits to sixteen (16) bits). Bits of the extended length polar code that are not used for bit repetition may be considered punctured bits of a polar code having a length of 2x. By definition of "repetition," the bit-channels carrying the repeated bits in the codeword may transmit frozen "0" bits, and thus the capacity of the repeated bit locations 1110 cannot be utilized.

In FIG. 11, the capacity of the unpolarized bit channel 1115 (e.g., eleven (11) coded bits, including the repeated bits) is redistributed to the polarized bit channel 1120 (e.g., eight (8) information bits).

Figure 12:
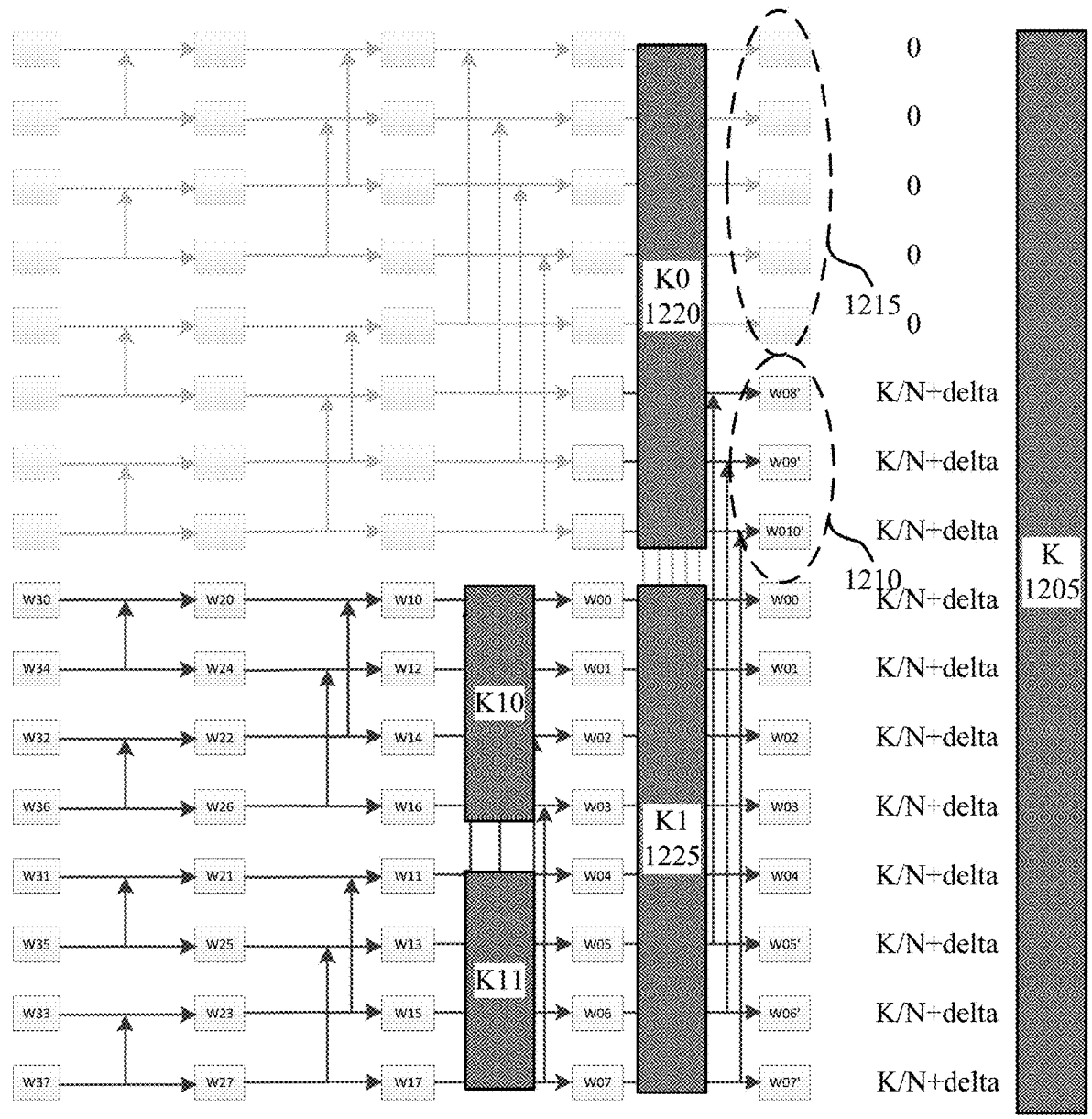
FIG. 12 illustrates an example of a polar coding scheme that supports a mutual-information based recursive polar code construction in accordance with various aspects of the present disclosure.

FIG. 12 illustrates an example of a polar coding scheme 1200 that supports a mutual-information based recursive polar code construction in accordance with various aspects of the present disclosure. In some cases, a transmitting device (e.g., a base station or a UE) may identify information for a transmission to a receiving device over a channel 'W'. In some examples, the polar coding scheme 1200 may be used to generate sixteen (16) coded bits 1205 for the transmission (e.g., eight (8) information bits (i.e., K=8) and eight (8) repeated, parity, and/or frozen bits). The transmitting device may identify that a portion of the coded bits (e.g., bits 1210) may be repeated bits for the transmission, and that another portion of the coded bits (e.g., bits 1215) may effectively be punctured bits. The transmitting device may adjust polar coding scheme 1200 based on the number and location of repeated bits 1210 and the number and location of punctured bits 1215. For example, the transmitting device may not assign any information bits to a first bit-channel 1220 (e.g., K0) of a first polarization stage (e.g., the capacity of K0 may be 0). The first bit-channel 1220 may correspond to (or include) the set of repeated bits 1210. Because no information bits are assigned to the bit-channel corresponding to the set of repeated bits 1210, all information bits may be assigned to a second bit-channel 1225 (e.g., K1) of the first polarization stage.

Because part of the polarized channel is not utilized, the initial target mutual information may be larger than K/N (e.g., K/N+delta). Following the first polarization stage, the capacity (or reliability ranks) of the bit-channels may be determined at each polarization stage as described with reference to FIG. 3.

Figure 13:
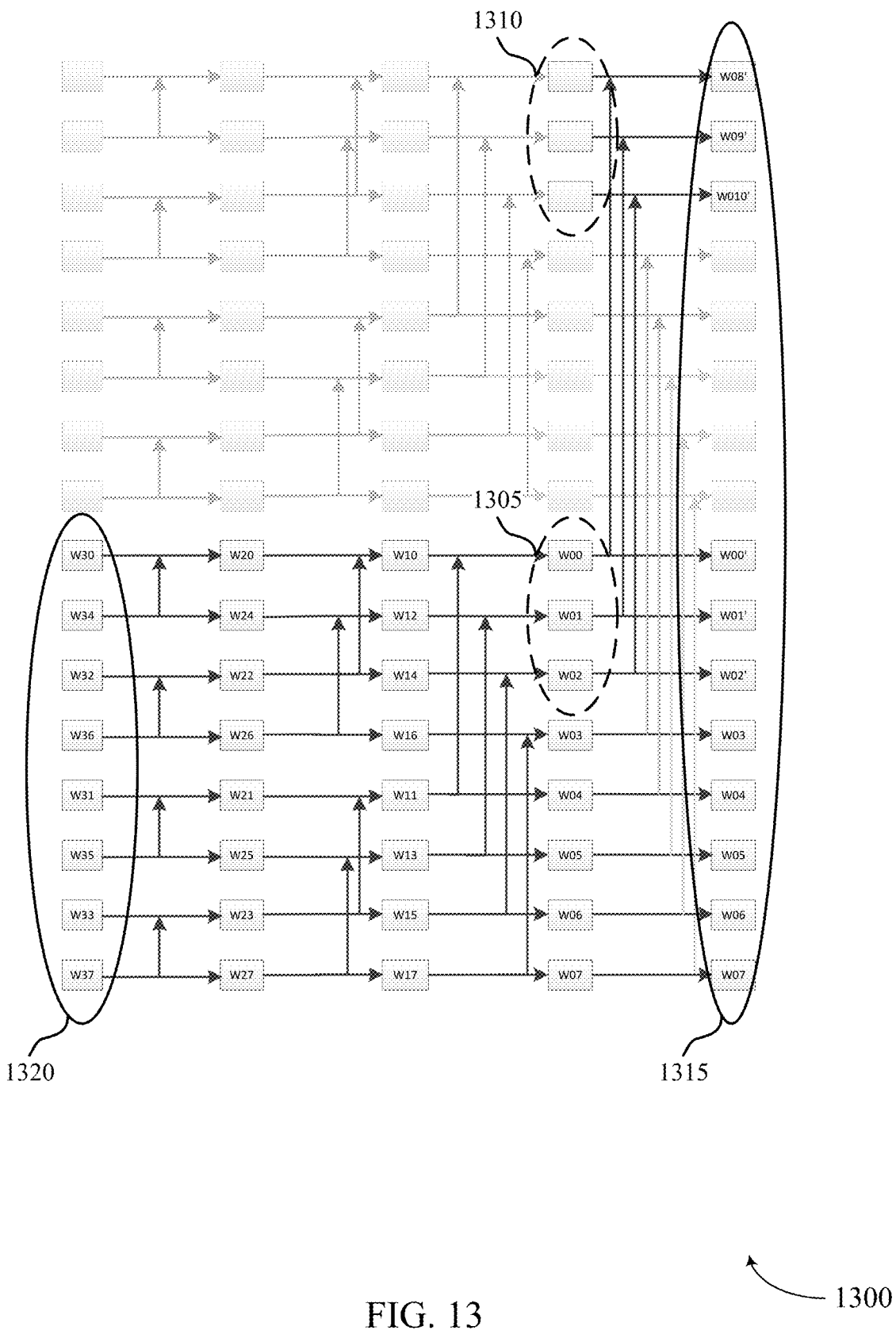
FIG. 13 illustrates an example of a polar coding scheme that employs bit repetition in accordance with various aspects of the present disclosure.

FIG. 13 illustrates an example of a polar coding scheme 1300 that employs bit repetition in accordance with various aspects of the present disclosure. In contrast to the polar coding scheme 1100 described with reference to FIG. 11, the polar coding scheme 1300 shows a codeword including eight (8) coded bits, with a least significant bit portion 1305 of the codeword (e.g., three (3) coded bits) being repeated in a set of repeated bit locations 1310. In some examples, the set of repeated bit locations 1310 may be provided by extending the length of the polar code used for the encoding (e.g., doubling the length of the polar code, from length x to length 2x (e.g., from eight (8) bits to sixteen (16) bits). Bits of the extended length polar code that are not used for bit repetition may be considered punctured bits of a polar code having a length of 2x. By definition of "repetition," the bit-channels carrying the repeated bits in the codeword may transmit frozen "0" bits, and thus the capacity of the repeated bit locations 1310 cannot be utilized.

In FIG. 13, the capacity of the unpolarized bit channel 1315 (e.g., eleven (11) coded bits, including the repeated bits) is redistributed to the polarized bit channel 1320 (e.g., eight (8) information bits).

Figure 14:
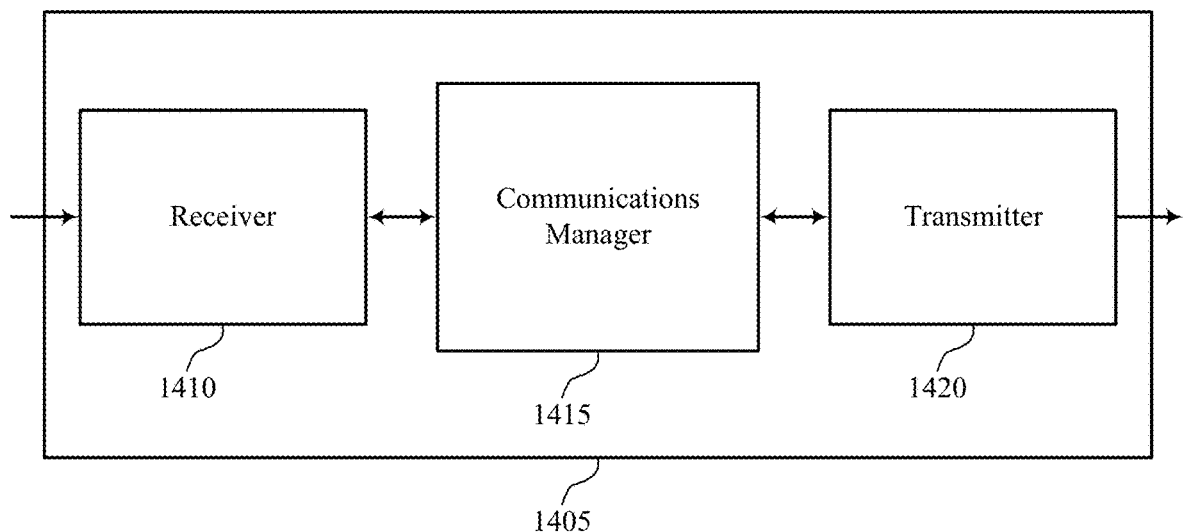
FIGS. 14 through 16 show block diagrams of a device that supports a mutual-information based recursive polar code construction in accordance with various aspects of the present disclosure.

FIG. 14 shows a block diagram 1400 of a wireless device 1405 that supports mutual-information based recursive polar code construction in accordance with aspects of the present disclosure as discussed above. Wireless device 1405 may be an example of aspects of a UE 115 or base station 105 as described with reference to FIG. 1. Wireless device 1405 may include receiver 1410, communications manager 1415, and transmitter 1420. wireless device 1405 may also include a processor. Each of these components may be in communication with one another (e.g., via one or more buses).

Receiver 1410 may receive signaling via an antenna. In some examples, the signaling may be encoded in one or more codewords using a polar code. The receiver may process the signaling (e.g., downconversion, filtering, analog-to-digital conversion, baseband processing) and may pass the processed signaling on to other components of the wireless device. The receiver 1410 may be an example of aspects of the transceiver 1735 described with reference to FIG. 17. The receiver 1410 may utilize a single antenna or a set of antennas.

Communications manager 1415 may be an example of aspects of the communications manager 1715 described with reference to FIG. 17. Communications manager 1415 and/or at least some of its various sub-components may be implemented in hardware, software executed by a processor, firmware, or any combination thereof. If implemented in software executed by a processor, the functions of the communications manager 1415 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The communications manager 1415 and/or at least some of its various sub-components may be physically located at various positions, including being distributed such that portions of functions are implemented at different physical locations by one or more physical devices. In some examples, communications manager 1415 and/or at least some of its various sub-components may be a separate and distinct component in accordance with various aspects of the present disclosure. In other examples, communications manager 1415 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 1415 may identify a set of repeated bit locations in the received codeword, identify a set of bit locations of the polar code used for information bits for the encoding, where the set of bit locations is determined based on recursively partitioning bit-channels of the polar code for each stage of polarization and assigning portions of a number of the information bits to bit-channel partitions of each stage of polarization based on a mutual information transfer function of respective aggregate capacities of the bit-channel partitions, where a target mutual information for a first polarization stage is determined as a function of the number of the information bits and a number of un-punctured bit locations in the received codeword, and where zero information bits are assigned to a first bit-channel partition of the first polarization stage, the first bit-channel partition corresponding to the set of repeated bit locations, and decode the received codeword according to the polar code to obtain an information bit vector at the set of bit locations.

The communications manager 1415 may also identify a set of bit locations of the polar code used for information bits for the encoding, where the set of bit locations is determined based on recursively partitioning bit-channels of the polar code for each stage of polarization and assigning portions of a number of the information bits to bit-channel partitions of each stage of polarization based on a mutual information transfer function of respective aggregate capacities of the bit-channel partitions, where the mutual information transfer function is based on a BEC function and a correction term, and where zero information bits are assigned to a first bit-channel partition of the first polarization stage, the first bit-channel partition corresponding to the set of repeated bit locations, and process the received codeword according to the polar code to obtain an information bit vector at the set of bit locations.

The communications manager 1415 may also identify a set of repeated bit locations for transmission of a codeword, the codeword to be generated from an information bit vector using a polar code, identify a set of bit locations of the polar code to be used for information bits of the information bit vector, where the set of bit locations is determined based on recursively partitioning bit-channels of the polar code for each stage of polarization and assigning portions of a number of information bits to bit-channel partitions of each stage of polarization based on a mutual information transfer function of respective aggregate capacities of the bit-channel partitions, where a target mutual information for a first polarization stage is determined as a function of the number of the information bits and a number of un-punctured bit locations in the received codeword, and where zero information bits are assigned to a first bit-channel partition of the first polarization stage, the first bit-channel partition corresponding to the set of repeated bit locations, and encode the information bit vector mapped to the set of bit locations using the polar code to obtain the codeword.

The communications manager 1415 may also identify an information bit vector for encoding using a polar code, identify a set of bit locations of the polar code to be used for information bits of the information bit vector, where the set of bit locations is determined based on recursively partitioning bit-channels of the polar code for each stage of polarization and assigning portions of a number of information bits to bit-channel partitions of each stage of polarization based on a mutual information transfer function of respective aggregate capacities of the bit-channel partitions, where the mutual information transfer function is based on a BEC function and a correction term, and where zero information bits are assigned to a first bit-channel partition of the first polarization stage, the first bit-channel partition corresponding to the set of repeated bit locations, and encode the information bit vector mapped to the set of bit locations using the polar code to obtain a codeword.

Transmitter 1420 may transmit signals generated by other components of the device. In some examples, the transmitter 1420 may be collocated with a receiver 1410 in a transceiver module. For example, the transmitter 1420 may be an example of aspects of the transceiver 1735 described with reference to FIG. 17. The transmitter 1420 may utilize a single antenna or a set of antennas. Transmitter 1420 may transmit the codeword over a wireless channel, where, in some cases, the transmitting includes puncturing the codeword at the set of punctured bit locations.

Figure 15:
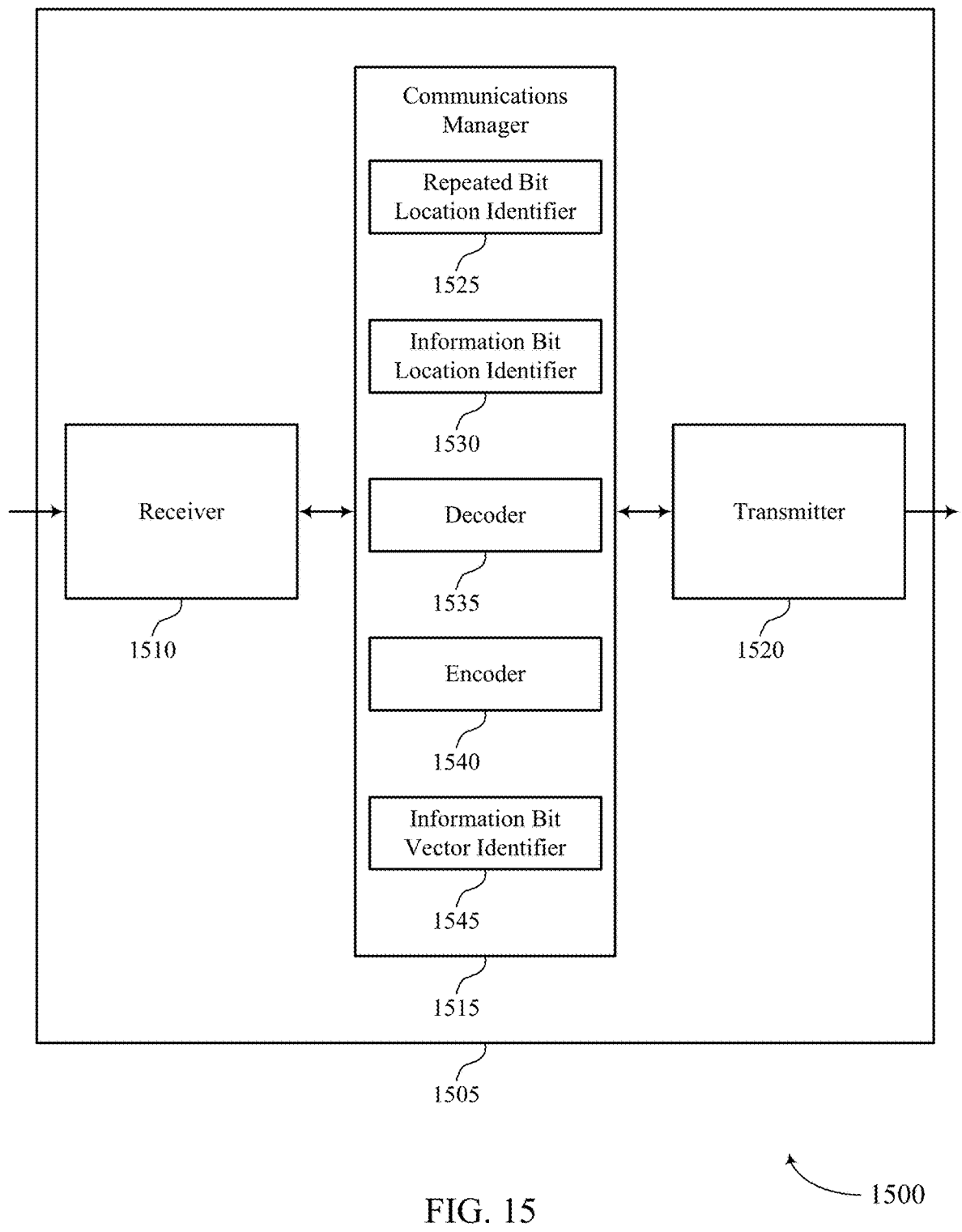

FIG. 15 shows a block diagram 1500 of a wireless device 1505 that supports mutual-information based recursive polar code construction in accordance with aspects of the present disclosure. Wireless device 1505 may be an example of aspects of a wireless device 1405 or a UE 115 or base station 105 as described with reference to FIGS. 1 and 14. Wireless device 1505 may include receiver 1510, communications manager 1515, and transmitter 1520. wireless device 1505 may also include a processor. Each of these components may be in communication with one another (e.g., via one or more buses).

Receiver 1510 may receive signaling via an antenna. In some examples, the signaling may be encoded in one or more codewords using a polar code. The receiver may process the signaling (e.g., downconversion, filtering, analog-to-digital conversion, baseband processing) and may pass the processed signaling on to other components of the wireless device. The receiver 1510 may be an example of aspects of the transceiver 1735 described with reference to FIG. 17. The receiver 1510 may utilize a single antenna or a set of antennas.

Communications manager 1515 may be an example of aspects of the communications manager 1715 described with reference to FIG. 17. Communications manager 1515 may include repeated bit location identifier 1525, information bit location identifier 1530, decoder 1535, encoder 1540, and information bit vector identifier 1545.

In some cases, repeated bit location identifier 1525 may identify a set of repeated bit locations in a received codeword, and, in other cases, repeated bit location identifier 1525 may identify a set of repeated bit locations for transmission of a codeword, the codeword to be generated from an information bit vector using a polar code.

Information bit location identifier 1530 may identify a set of bit locations of the polar code used for (or to be used for) information bits for the encoding, where the set of bit locations is determined based on recursively partitioning bit-channels of the polar code for each stage of polarization and assigning portions of a number of the information bits to bit-channel partitions of each stage of polarization based on a mutual information transfer function of respective aggregate capacities of the bit-channel partitions, where a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations. In some cases, the target mutual information is determined to be greater than the number of the information bits divided by the number of bit locations in the transmitted codeword. In some cases, for each stage of polarization, a capacity of each bit-channel of each of the bit-channel partitions is determined based on bit-channel capacities of input bit-channels from the previous stage of polarization and the mutual information transfer function.

In some cases, information bit location identifier 1530 may identify a set of bit locations of the polar code to be used for (or used for) information bits of an information bit vector, where the set of bit locations is determined based on recursively partitioning bit-channels of the polar code for each stage of polarization and assigning portions of a number of information bits to bit-channel partitions of each stage of polarization based on a mutual information transfer function of respective aggregate capacities of the bit-channel partitions, where a target mutual information for a first polarization stage is determined as a function of the number of the information bits and a number of bit locations in the received codeword, and where zero information bits are assigned to a first bit-channel partition of the first polarization stage, the first bit-channel partition corresponding to the set of repeated bit locations. In some cases, the target mutual information is determined to be greater than the number of the information bits divided by the number of bit locations in the received codeword. In some cases, for the each stage of polarization, a capacity of each bit-channel of each of the bit-channel partitions is determined based on bit-channel capacities of input bit-channels from the previous stage of polarization and the mutual information transfer function.

In some cases, the mutual information transfer function is based on a BEC function and a correction term. In some cases, the correction term is based on a function of a bit-channel capacity of the each stage of polarization and a capacity imbalance factor. In some cases, the correction term includes an offset factor applied to the bit-channel capacity. In some cases, the correction term includes a scaling factor applied to the offset bit-channel capacity. In some cases, the correction term includes an offset applied to the scaled and offset bit-channel capacity.

Decoder 1535 may decode the received codeword according to the polar code to obtain an information bit vector at the set of bit locations and process the received codeword according to the polar code to obtain an information bit vector at the set of bit locations. Encoder 1540 may encode the information bit vector mapped to the set of bit locations using the polar code to obtain the codeword and encode the information bit vector mapped to the set of bit locations using the polar code to obtain a codeword. Information bit vector identifier 1545 may identify an information bit vector for encoding using a polar code.

Transmitter 1520 may transmit signals generated by other components of the device. In some examples, the transmitter 1520 may be collocated with a receiver 1510 in a transceiver module. For example, the transmitter 1520 may be an example of aspects of the transceiver 1735 described with reference to FIG. 17. The transmitter 1520 may utilize a single antenna or a set of antennas.

Figure 16:
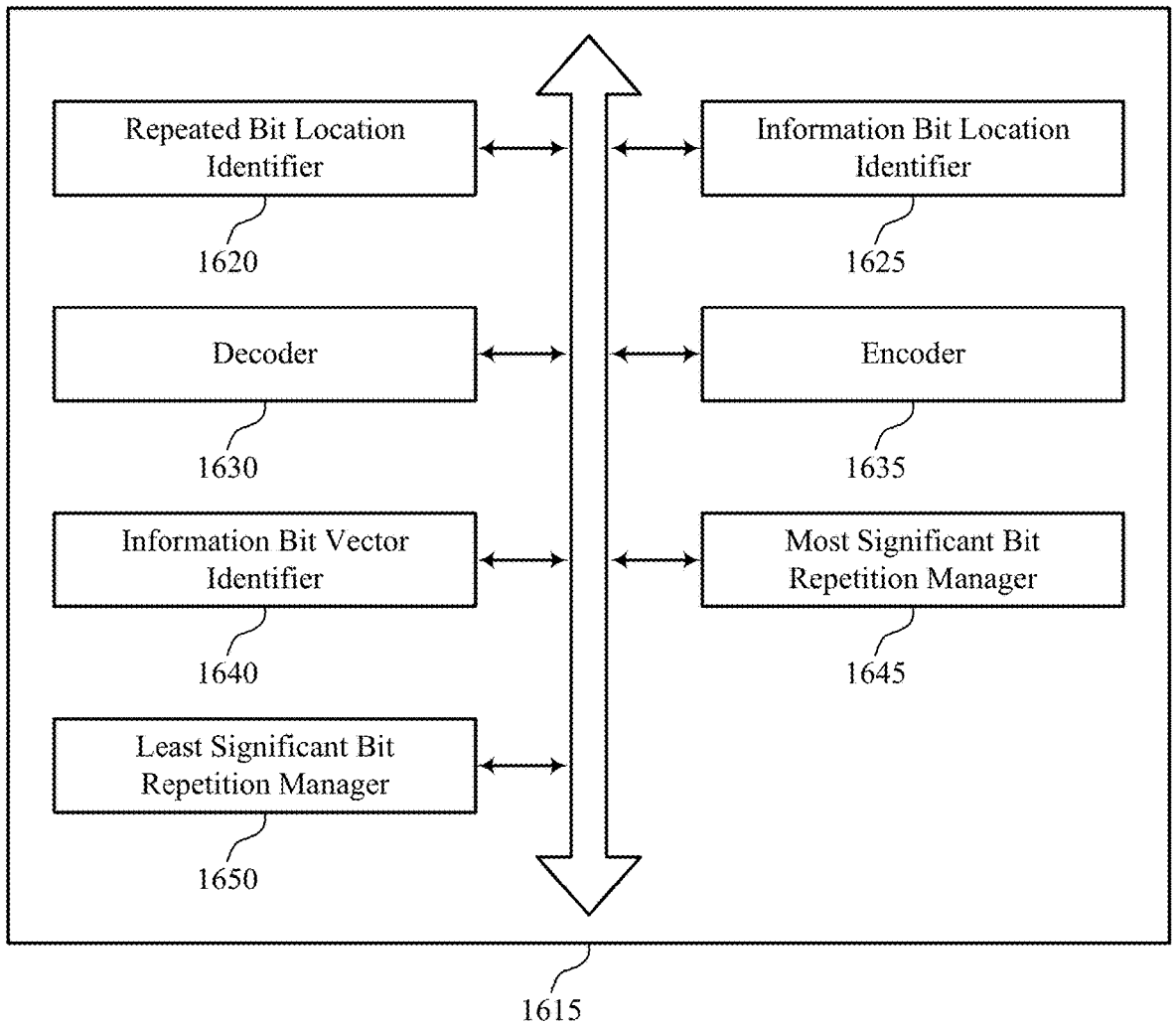

FIG. 16 shows a block diagram 1600 of a communications manager 1615 that supports mutual-information based recursive polar code construction in accordance with aspects of the present disclosure. The communications manager 1615 may be an example of aspects of a communications manager 1415, a communications manager 1515, or a communications manager 1715 described with reference to FIGS. 14, 15, and 17. The communications manager 1615 may include repeated bit location identifier 1620, information bit location identifier 1625, decoder 1630, encoder 1635, information bit vector identifier 1640, most significant bit repetition manager 1645, and least significant bit repetition manager 1650. Each of these modules may communicate, directly or indirectly, with one another (e.g., via one or more buses).

In some cases, repeated bit location identifier 1620 may identify a set of repeated bit locations in the received codeword, and, in other cases, repeated bit location identifier 1620 may identify a set of repeated bit locations for transmission of a codeword, the codeword to be generated from an information bit vector using a polar code.

Information bit location identifier 1625 may identify a set of bit locations of the polar code used for (or to be used for) information bits for the encoding, where the set of bit locations is determined based on recursively partitioning bit-channels of the polar code for each stage of polarization and assigning portions of a number of the information bits to bit-channel partitions of each stage of polarization based on a mutual information transfer function of respective aggregate capacities of the bit-channel partitions, where a target mutual information for a first polarization stage is determined as a function of the number of the information bits and a number of bit locations in the received codeword, and where zero information bits are assigned to a first bit-channel partition of the first polarization stage, the first bit-channel partition corresponding to the set of repeated bit locations. In some cases, the target mutual information is determined to be greater than the number of the information bits divided by the number of bit locations in the received codeword. In some cases, for the each stage of polarization, a capacity of each bit-channel of each of the bit-channel partitions is determined based on bit-channel capacities of input bit-channels from the previous stage of polarization and the mutual information transfer function.

In some cases, information bit location identifier 1625 may identify a set of bit locations of the polar code to be used for (or used for) information bits of an information bit vector, where the set of bit locations is determined based on recursively partitioning bit-channels of the polar code for each stage of polarization and assigning portions of a number of information bits to bit-channel partitions of each stage of polarization based on a mutual information transfer function of respective aggregate capacities of the bit-channel partitions where, a target mutual information for a first polarization stage is determined as a function of the number of the information bits and a number of bit locations in the received codeword, and where zero information bits are assigned to a first bit-channel partition of the first polarization stage, the first bit-channel partition corresponding to the set of repeated bit locations. In some cases, the target mutual information is determined to be greater than the number of the information bits divided by the number of bit locations in the received codeword. In some cases, for the each stage of polarization, a capacity of each bit-channel of each of the bit-channel partitions is determined based on bit-channel capacities of input bit-channels from the previous stage of polarization and the mutual information transfer function.

In some cases, the mutual information transfer function is based on a BEC function and a correction term. In some cases, the correction term is based on a function of a bit-channel capacity of the each stage of polarization and a capacity imbalance factor. In some cases, the correction term includes an offset factor applied to the bit-channel capacity. In some cases, the correction term includes a scaling factor applied to the offset bit-channel capacity. In some cases, the correction term includes an offset applied to the scaled and offset bit-channel capacity.

Decoder 1630 may decode the received codeword according to the polar code to obtain an information bit vector at the set of bit locations and process the received codeword according to the polar code to obtain an information bit vector at the set of bit locations. Encoder 1635 may encode the information bit vector mapped to the set of bit locations using the polar code to obtain the codeword and encode the information bit vector mapped to the set of bit locations using the polar code to obtain a codeword. Information bit vector identifier 1640 may identify an information bit vector for encoding using a polar code.

Most significant bit repetition manager 1645 may identify a most significant set of bits repeated (or to be repeated) in a transmission.

Least significant bit repetition manager 1650 may identify a least significant set of bits repeated (or to be repeated) in a transmission.

Figure 17:
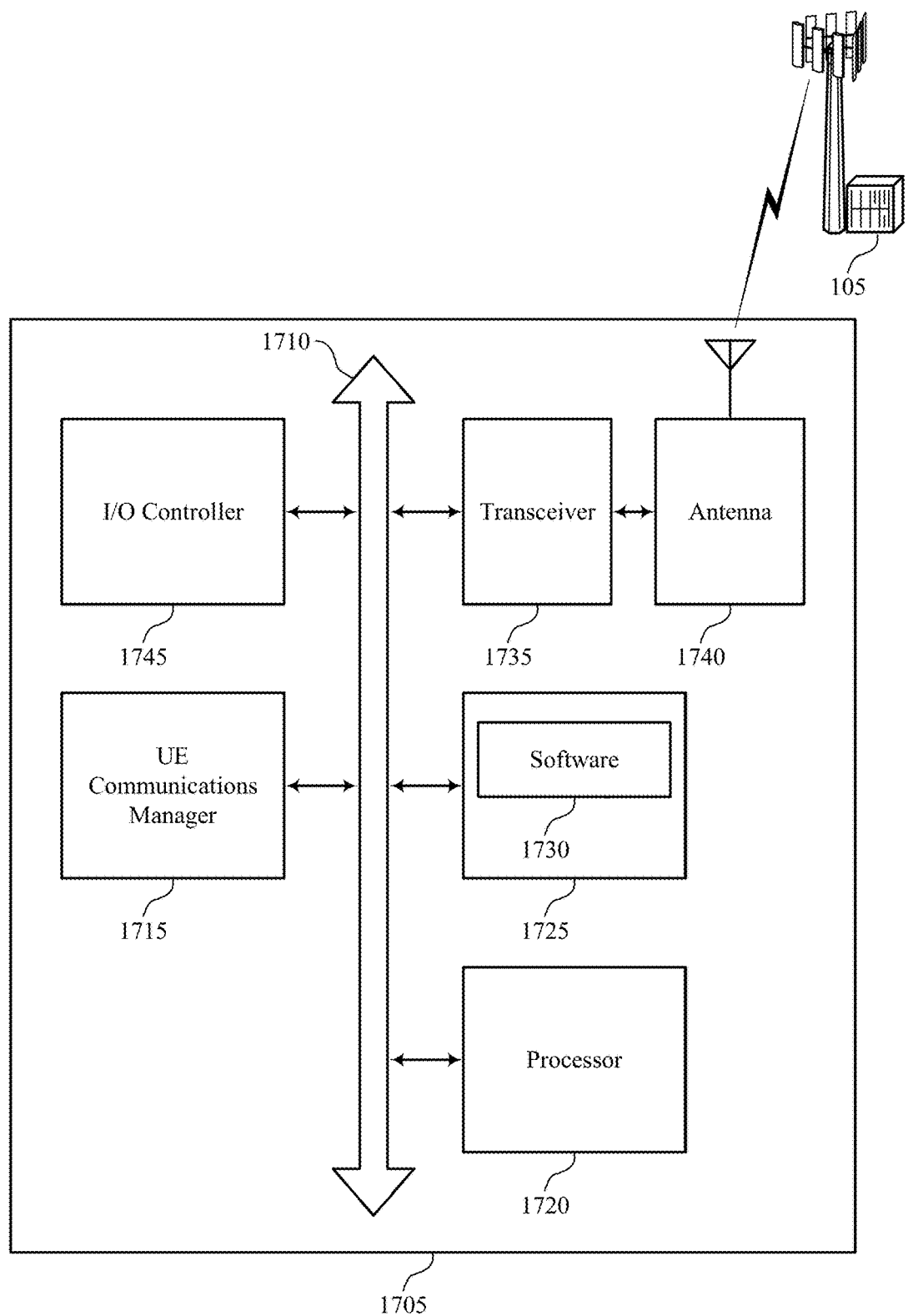
FIG. 17 illustrates a block diagram of a system including a device (e.g., a UE) that supports mutual-information based recursive polar code construction in accordance with various aspects of the present disclosure

FIG. 17 illustrates a block diagram of a system 1700 including a device 1705 (e.g., a UE) that supports mutual-information based recursive polar code construction in accordance with various aspects of the present disclosure. Device 1705 may be an example of or include the components of wireless device 1405, wireless device 1505, or a UE 115 as described above, e.g., with reference to FIGS. 1, 14 and 15. Device 1705 may include components for bi-directional voice and data communications including components for transmitting and receiving communications, including UE communications manager 1715, processor 1720, memory 1725, software 1730, transceiver 1735, antenna 1740, and I/O controller 1745. These components may be in electronic communication via one or more busses (e.g., bus 1710). Device 1705 may communicate wirelessly with one or more base stations 105.

Processor 1720 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1720 may be configured to operate a memory array using a memory controller. In other cases, a memory controller may be integrated into processor 1720. Processor 1720 may be configured to execute computer-readable instructions stored in a memory to perform various functions (e.g., functions or tasks supporting mutual-information based recursive polar code construction).

Memory 1725 may include random access memory (RAM) and read only memory (ROM). The memory 1725 may store computer-readable, computer-executable software 1730 including instructions that, when executed, cause the processor to perform various functions described herein. In some cases, the memory 1725 may contain, among other things, a basic input/output system (BIOS) which may control basic hardware and/or software operation such as the interaction with peripheral components or devices.

Software 1730 may include code to implement aspects of the present disclosure, including code to support mutual-information based recursive polar code construction. Software 1730 may be stored in a non-transitory computer-readable medium such as system memory or other memory. In some cases, the software 1730 may not be directly executable by the processor but may cause a computer (e.g., when compiled and executed) to perform functions described herein.

Transceiver 1735 may communicate bi-directionally, via one or more antennas, wired, or wireless links as described above. For example, the transceiver 1735 may represent a wireless transceiver and may communicate bi-directionally with another wireless transceiver. The transceiver 1735 may also include a modem to modulate the packets and provide the modulated packets to the antennas for transmission, and to demodulate packets received from the antennas.

In some cases, the wireless device may include a single antenna 1740. However, in some cases the device may have more than one antenna 1740, which may be capable of concurrently transmitting or receiving multiple wireless transmissions.

I/O controller 1745 may manage input and output signals for device 1705. I/O controller 1745 may also manage peripherals not integrated into device 1705. In some cases, I/O controller 1745 may represent a physical connection or port to an external peripheral. In some cases, I/O controller 1745 may utilize an operating system such as iOS®, ANDROID®, MS-DOS®, MS-WINDOWS®, OS/2®, UNIX®, LINUX®, or another known operating system. In other cases, I/O controller 1745 may represent or interact with a modem, a keyboard, a mouse, a touchscreen, or a similar device. In some cases, I/O controller 1745 may be implemented as part of a processor. In some cases, a user may interact with device 1705 via I/O controller 1745 or via hardware components controlled by I/O controller 1745.

Figure 18:
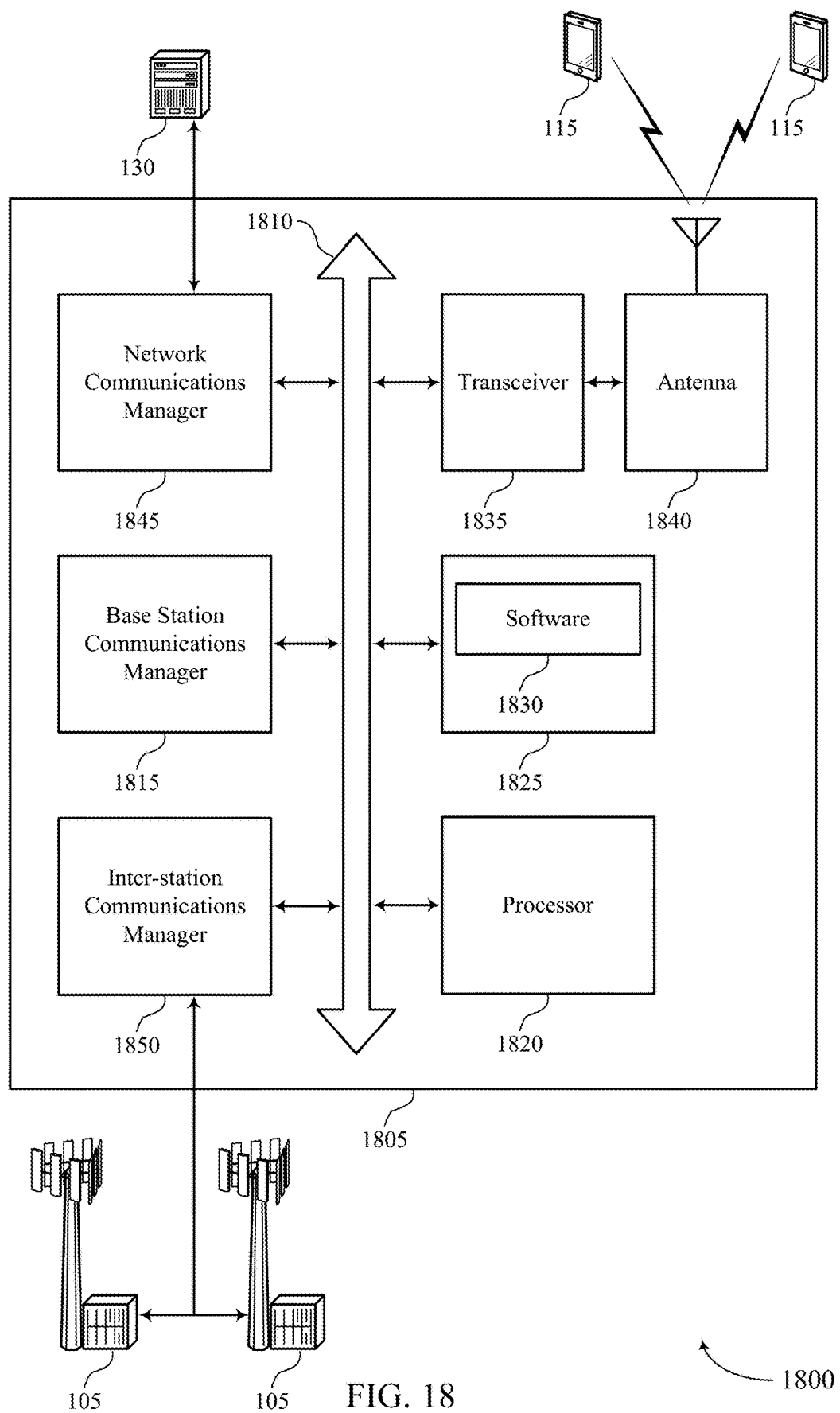
FIG. 18 illustrates a block diagram of a system including device (e.g., a base station) that supports mutual-information based recursive polar code construction in accordance with various aspects of the present disclosure.

FIG. 18 illustrates a block diagram of a system 1800 including device 1805 (e.g., a base station) that supports mutual-information based recursive polar code construction in accordance with various aspects of the present disclosure. Device 1805 may be an example of or include the components of wireless device 1505, wireless device 1605, or a base station 105 as described above, e.g., with reference to FIGS. 1, 15 and 16. Device 1805 may include components for bi-directional voice and data communications including components for transmitting and receiving communications, including base station communications manager 1815, processor 1820, memory 1825, software 1830, transceiver 1835, antenna 1840, network communications manager 1845, and inter-station communications manager 1850. These components may be in electronic communication via one or more busses (e.g., bus 1810). Device 1805 may communicate wirelessly with one or more UEs 115.

Processor 1820 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1820 may be configured to operate a memory array using a memory controller. In other cases, a memory controller may be integrated into processor 1820. Processor 1820 may be configured to execute computer-readable instructions stored in a memory to perform various functions (e.g., functions or tasks supporting mutual-information based recursive polar code construction).

Memory 1825 may include RAM and ROM. The memory 1825 may store computer-readable, computer-executable software 1830 including instructions that, when executed, cause the processor to perform various functions described herein. In some cases, the memory 1825 may contain, among other things, a BIOS which may control basic hardware and/or software operation such as the interaction with peripheral components or devices.

Software 1830 may include code to implement aspects of the present disclosure, including code to support mutual-information based recursive polar code construction. Software 1830 may be stored in a non-transitory computer-readable medium such as system memory or other memory. In some cases, the software 1830 may not be directly executable by the processor but may cause a computer (e.g., when compiled and executed) to perform functions described herein.

Transceiver 1835 may communicate bi-directionally, via one or more antennas, wired, or wireless links as described above. For example, the transceiver 1835 may represent a wireless transceiver and may communicate bi-directionally with another wireless transceiver. The transceiver 1835 may also include a modem to modulate the packets and provide the modulated packets to the antennas for transmission, and to demodulate packets received from the antennas.

In some cases, the wireless device may include a single antenna 1840. However, in some cases the device may have more than one antenna 1840, which may be capable of concurrently transmitting or receiving multiple wireless transmissions.

Network communications manager 1845 may manage communications with the core network (e.g., via one or more wired backhaul links). For example, the network communications manager 1845 may manage the transfer of data communications for client devices, such as one or more UEs 115.

Inter-station communications manager 1850 may manage communications with other base station 105, and may include a controller or scheduler for controlling communications with UEs 115 in cooperation with other base stations 105. For example, the inter-station communications manager 1850 may coordinate scheduling for transmissions to UEs 115 for various interference mitigation techniques such as beamforming or joint transmission. In some examples, inter-station communications manager 1850 may provide an X2 interface within an Long Term Evolution (LTE)/LTE-A wireless communication network technology to provide communication between base stations 105.

Figure 19:
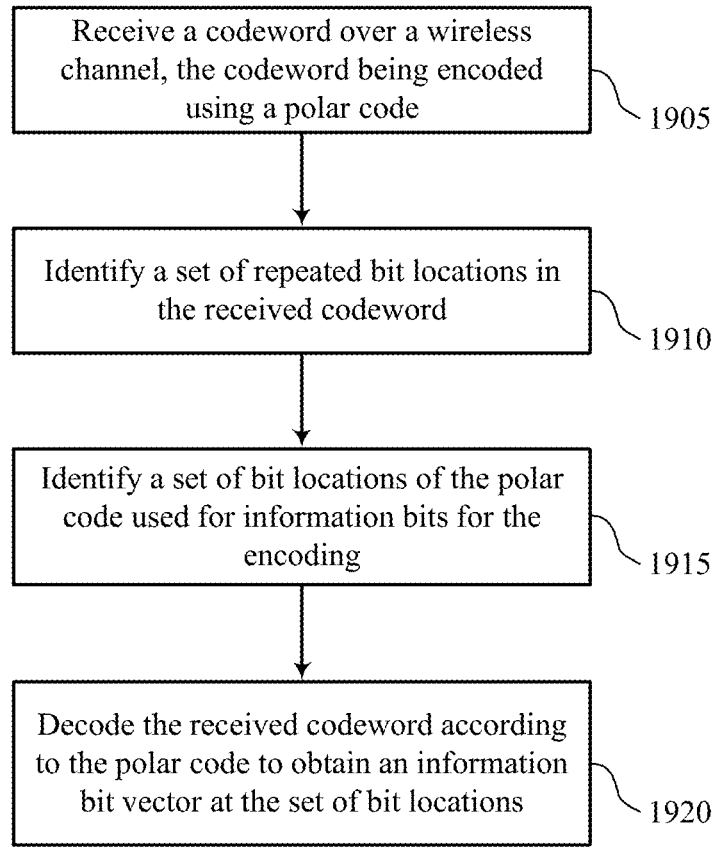
FIGS. 19 through 22 illustrate flowcharts of methods for a mutual-information based recursive polar code construction in accordance with various aspects of the present disclosure.

FIG. 19 shows a flowchart illustrating a method 1900 for mutual-information based recursive polar code construction in accordance with aspects of the present disclosure. The operations of method 1900 may be implemented by a UE 115 or base station 105 or its components as described herein. For example, the operations of method 1900 may be performed by a communications manager as described with reference to FIGS. 14 through 16. In some examples, a UE 115 or base station 105 may execute a set of codes to control the functional elements of the device to perform the functions described below. Additionally or alternatively, the UE 115 or base station 105 may perform aspects of the functions described below using special-purpose hardware. In either case, whether the UE 115 or base station 105 perform the operations of method 1900 by executing a set of codes to control functional elements of the device, or using special-purpose hardware (or through some other way), such operations may markedly improve aspects of the functionality of the UE 115 of base station 105 themselves.

At block 1905 the UE 115 or base station 105 may receive a codeword over a wireless channel, the codeword being encoded using a polar code. The operations of block 1905 may be performed according to the methods described with reference to FIGS. 1 through 13. In certain examples, aspects of the operations of block 1905 may be performed by a receiver as described with reference to FIGS. 14 through 16.

At block 1910 the UE 115 or base station 105 may identify a set of repeated bit locations in the received codeword. The operations of block 1910 may be performed according to the methods described with reference to FIGS. 1 through 13. In certain examples, aspects of the operations of block 1910 may be performed by a punctured bit location identifier as described with reference to FIGS. 14 through 16.

At block 1915 the UE 115 or base station 105 may identify a set of bit locations of the polar code used for information bits for the encoding, wherein the set of bit locations is determined based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations. The operations of block 1915 may be performed according to the methods described with reference to FIGS. 1 through 13. In certain examples, aspects of the operations of block 1915 may be performed by an information bit location identifier as described with reference to FIGS. 14 through 16.

At block 1920 the UE 115 or base station 105 may decode the received codeword according to the polar code to obtain an information bit vector at the set of bit locations. The operations of block 1920 may be performed according to the methods described with reference to FIGS. 1 through 13. In certain examples, aspects of the operations of block 1920 may be performed by a decoder as described with reference to FIGS. 14 through 16.

Figure 20:
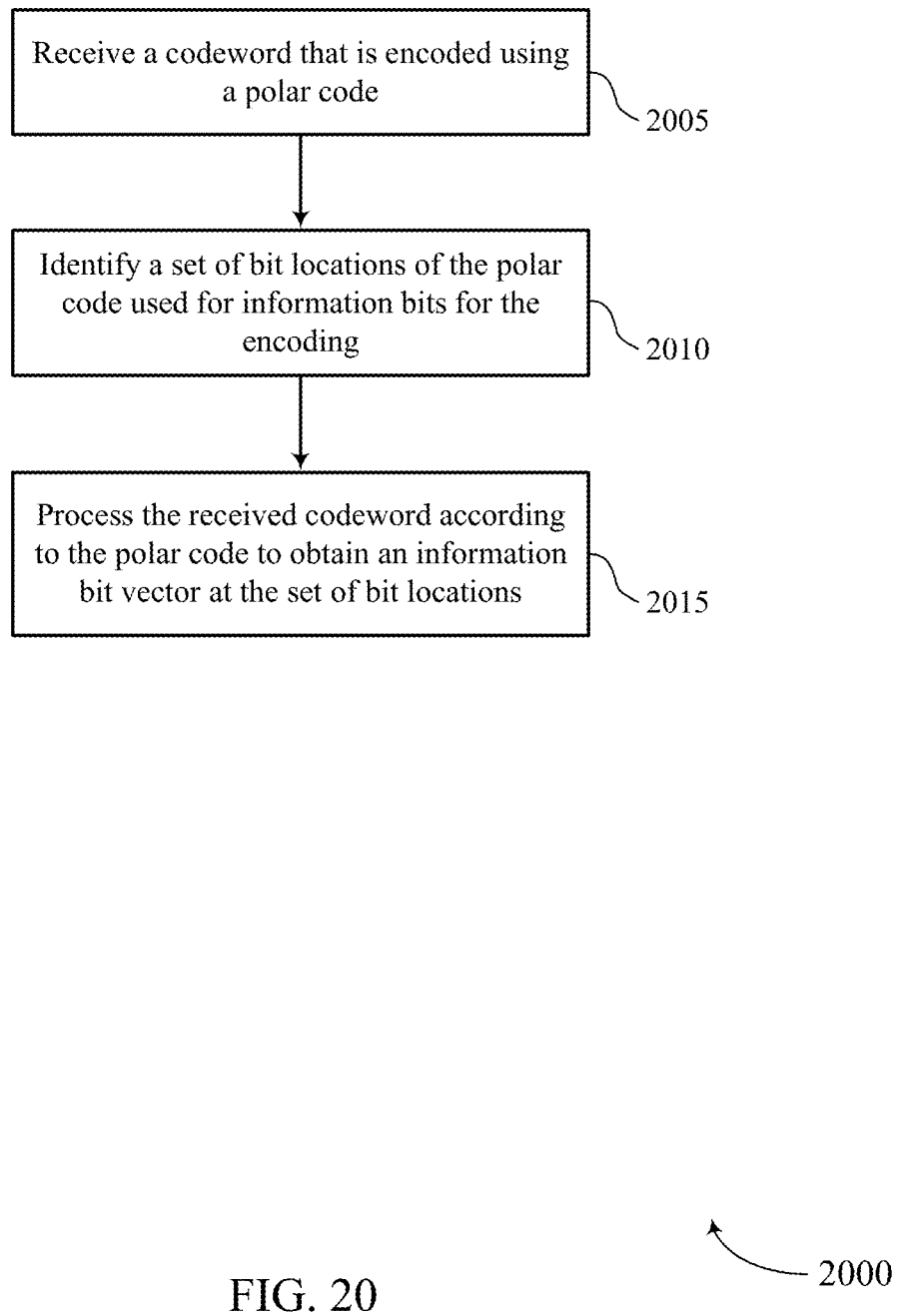

FIG. 20 shows a flowchart illustrating a method 2000 for mutual-information based recursive polar code construction in accordance with aspects of the present disclosure. The operations of method 2000 may be implemented by a UE 115 or base station 105 or its components as described herein. For example, the operations of method 2000 may be performed by a communications manager as described with reference to FIGS. 14 through 16. In some examples, a UE 115 or base station 105 may execute a set of codes to control the functional elements of the device to perform the functions described below. Additionally or alternatively, the UE 115 or base station 105 may perform aspects of the functions described below using special-purpose hardware. In either case, whether the UE 115 or base station 105 perform the operations of method 1900 by executing a set of codes to control functional elements of the device, or using special-purpose hardware (or through some other way), such operations may markedly improve aspects of the functionality of the UE 115 of base station 105 themselves.

At block 2005 the UE 115 or base station 105 may receive a codeword that is encoded using a polar code. The operations of block 2005 may be performed according to the methods described with reference to FIGS. 1 through 13. In certain examples, aspects of the operations of block 2005 may be performed by a receiver as described with reference to FIGS. 14 through 16.

At block 2010 the UE 115 or base station 105 may identify a set of bit locations of the polar code used for information bits for the encoding, wherein the set of bit locations is determined based at least in part on recursively partitioning bit-channels of the polar code for each stage of polarization and assigning portions of a number of the information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations. The operations of block 2010 may be performed according to the methods described with reference to FIGS. 1 through 13. In certain examples, aspects of the operations of block 2010 may be performed by an information bit location identifier as described with reference to FIGS. 14 through 16.

At block 2015 the UE 115 or base station 105 may process the received codeword according to the polar code to obtain an information bit vector at the set of bit locations. The operations of block 2015 may be performed according to the methods described with reference to FIGS. 1 through 13. In certain examples, aspects of the operations of block 2015 may be performed by a decoder as described with reference to FIGS. 14 through 16.

Figure 21:
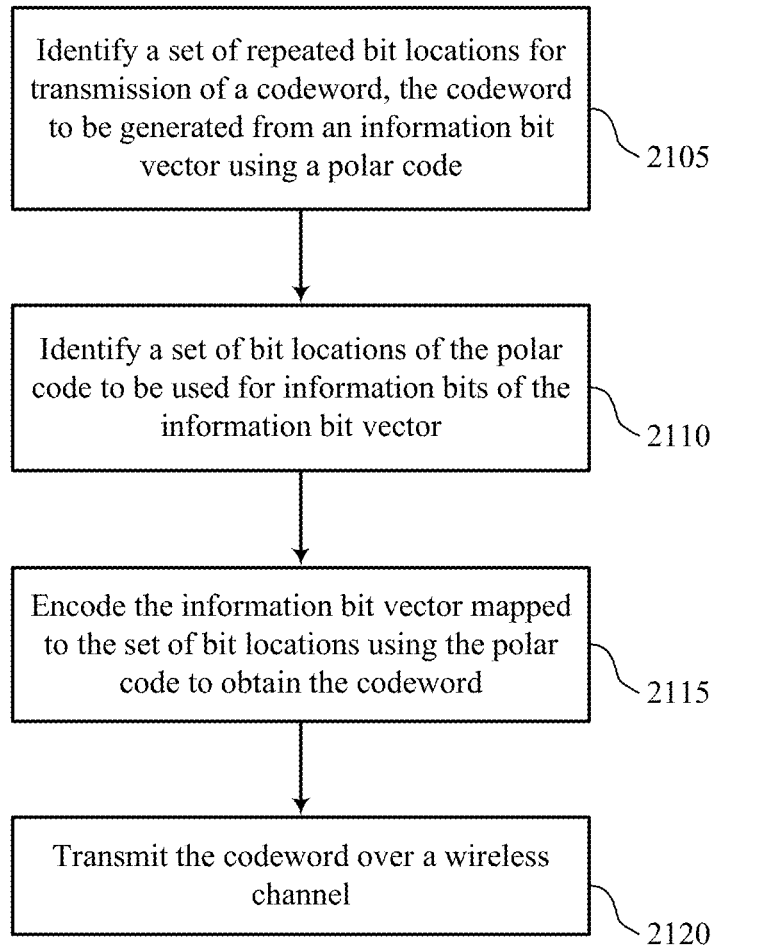

FIG. 21 shows a flowchart illustrating a method 2100 for mutual-information based recursive polar code construction in accordance with aspects of the present disclosure. The operations of method 2100 may be implemented by a UE 115 or base station 105 or its components as described herein. For example, the operations of method 2100 may be performed by a communications manager as described with reference to FIGS. 14 through 16. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2105 the UE 115 or base station 105 may identify a set of punctured bit locations for transmission of a codeword, the codeword to be generated from an information bit vector using a polar code. The operations of block 2105 may be performed according to the methods described with reference to FIGS. 1 through 13. In certain examples, aspects of the operations of block 2105 may be performed by a punctured bit location identifier as described with reference to FIGS. 14 through 16.

At block 2110 the UE 115 or base station 105 may identify a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, and wherein a target mutual information for a first polarization stage is determined as a function of the number of the information bits and a number of bit locations in the received codeword, and wherein zero information bits are assigned to a first bit-channel partition of the first polarization stage, the first bit-channel partition corresponding to the set of repeated bit locations. The operations of block 2110 may be performed according to the methods described with reference to FIGS. 1 through 13. In certain examples, aspects of the operations of block 2110 may be performed by an information bit location identifier as described with reference to FIGS. 14 through 16.

At block 2115 the UE 115 or base station 105 may encode the information bit vector mapped to the set of bit locations using the polar code to obtain the codeword. The operations of block 2115 may be performed according to the methods described with reference to FIGS. 1 through 13. In certain examples, aspects of the operations of block 2115 may be performed by a encoder as described with reference to FIGS. 14 through 16.

At block 2120 the UE 115 or base station 105 may transmit the codeword over a wireless channel. The operations of block 2120 may be performed according to the methods described with reference to FIGS. 1 through 13. In certain examples, aspects of the operations of block 2120 may be performed by a transmitter as described with reference to FIGS. 14 through 16.

Figure 22:
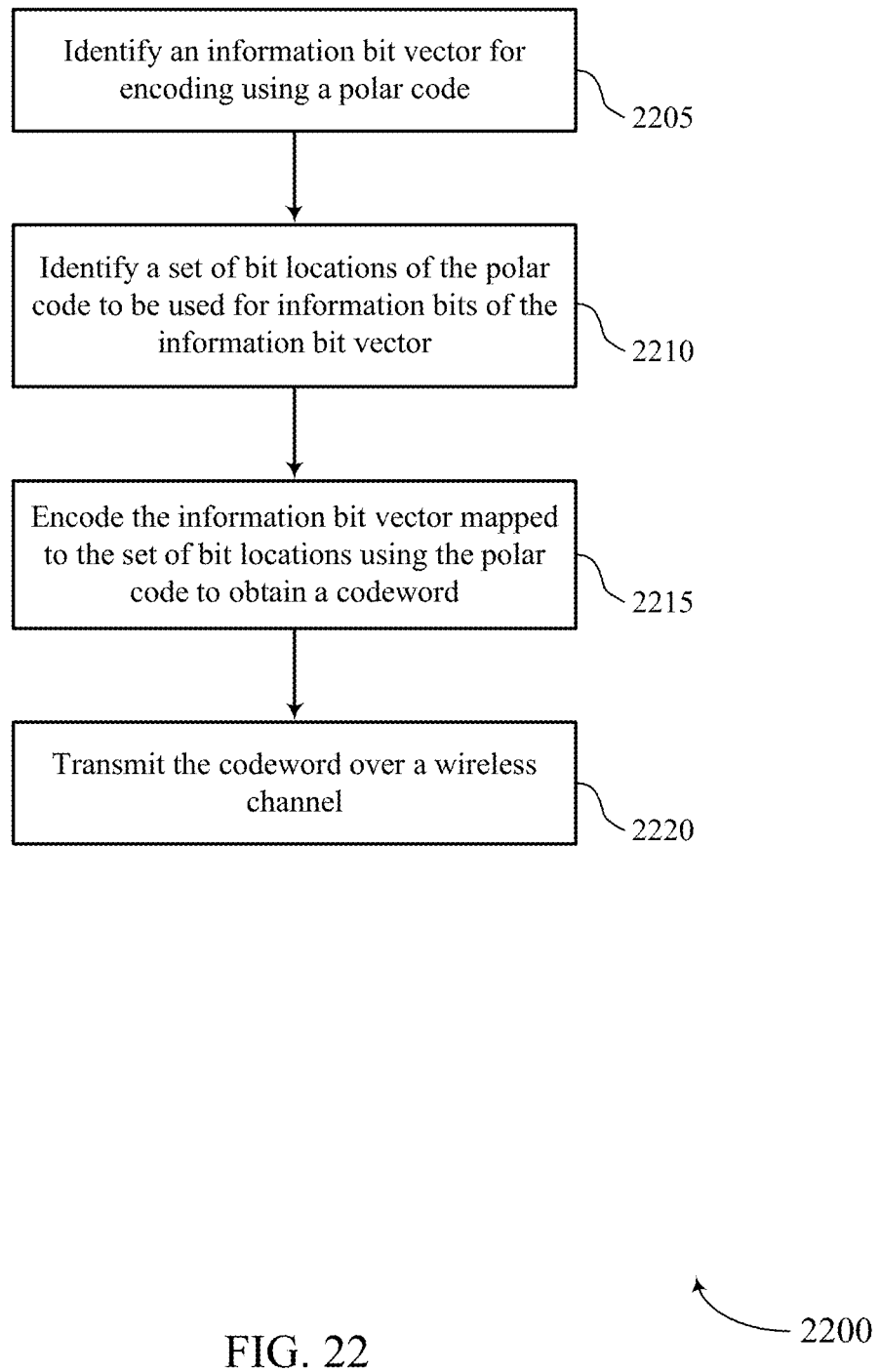

FIG. 22 shows a flowchart illustrating a method 2200 for mutual-information based recursive polar code construction in accordance with aspects of the present disclosure. The operations of method 2200 may be implemented by a UE 115 or base station 105 or its components as described herein. For example, the operations of method 2200 may be performed by a communications manager as described with reference to FIGS. 14 through 16. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2205 the UE 115 or base station 105 may identify an information bit vector for encoding using a polar code. The operations of block 2205 may be performed according to the methods described with reference to FIGS. 1 through 13. In certain examples, aspects of the operations of block 2205 may be performed by an information bit vector identifier as described with reference to FIGS. 14 through 16.

At block 2210 the UE 115 or base station 105 may identify a set of bit locations of the polar code to be used for information bits of the information bit vector, wherein the set of bit locations is determined based at least in part on recursively partitioning bit-channels of the polar code for each stage of polarization and assigning portions of a number of information bits to bit-channel partitions of each stage of polarization based on a mutual information transfer function of respective aggregate capacities of the bit-channel partitions, wherein the mutual information transfer function is based on a BEC function and a correction term, and wherein zero information bits are assigned to a first bit-channel partition of the first polarization stage, the first bit-channel partition corresponding to the set of repeated bit locations. The operations of block 2210 may be performed according to the methods described with reference to FIGS. 1 through 13. In certain examples, aspects of the operations of block 2210 may be performed by an information bit location identifier as described with reference to FIGS. 14 through 16.

At block 2215 the UE 115 or base station 105 may encode the information bit vector mapped to the set of bit locations using the polar code to obtain a codeword. The operations of block 2215 may be performed according to the methods described with reference to FIGS. 1 through 13. In certain examples, aspects of the operations of block 2215 may be performed by a encoder as described with reference to FIGS. 14 through 16.

At block 2220 the UE 115 or base station 105 may transmit the codeword over a wireless channel. The operations of block 2220 may be performed according to the methods described with reference to FIGS. 1 through 13. In certain examples, aspects of the operations of block 2220 may be performed by a transmitter as described with reference to FIGS. 14 through 16.

It should be noted that the methods described above describe possible implementations. In some examples, aspects from two or more of the methods 1900, 2000, 2100 or 2200 described with reference to FIGS. 19-22 may be combined. It should be noted that the methods 1900, 2000, 2100 or 2200 are just example implementations, and that the operations of the methods 1900, 2000, 2100 or 2200 may be rearranged or otherwise modified such that other implementations are possible.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are releases of Universal Mobile Telecommunications System (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of evolved node B (eNBs) provide coverage for various geographical regions. For example, each eNB, gNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), next generation NodeB (gNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, those of wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates an inclusive list such that, for example, a phrase referring to "at least one of" a list of items refers to any combination of those items, including single members. As an example, "at least one of: A, B, or C" is intended to cover A, B, C, A-B, A-C, B-C, and A-B-C., as well as any combination with multiples of the same element (e.g., A-A, A-A-A, A-A-B, A-A-C, A-B-B, A-C-C, B-B, B-B-B, B-B-C, C-C, and C-C-C or any other ordering of A, B, and C).

Also, as used herein, the phrase "based on" shall not be construed as a reference to a closed set of conditions. For example, an exemplary feature that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving an encoded codeword over a wireless channel via a wireless communication interface configured to receive wireless data signals;
   identifying a set of repeated bit locations in the received codeword;
   identifying a set of bit locations of a polar code used for information bits for the encoding,
   wherein the set of bit locations is identified based at least in part on recursively partitioning bit-channels of the polar code for each stage of polarization and assigning portions of a number of the information bits to bit-channel partitions of each stage of polarization based at least in part on a mutual information transfer function of respective aggregate capacities of the bit-channel partitions,
   wherein a target mutual information for a first polarization stage is determined as a function of the number of the information bits and a number of bit locations in the received codeword,
   wherein zero information bits are assigned to a first bit-channel partition of the first polarization stage, the first bit-channel partition corresponding to the set of repeated bit locations; and
   decoding the received codeword according to the polar code to obtain an information bit vector at the set of bit locations.

2. The method of claim 1, further comprising:
   determining that the target mutual information is greater than the number of the information bits divided by the number of bit locations in the received codeword.

3. The method of claim 1, further comprising:
   determining, for the each stage of polarization, a capacity of each bit-channel of each of the bit-channel partitions, based at least in part on bit-channel capacities of input bit-channels from the previous stage of polarization and the mutual information transfer function.

4. The method of claim 1, wherein the set of repeated bit locations correspond to at least one of a most significant bit portion of the received codeword, a least significant bit portion of the received codeword, an intermediate portion of the received codeword between a most significant bit and a least significant bit, or a combination thereof.

5. The method of claim 1, wherein the mutual information transfer function is based at least in part on a binary erasure channel (BEC) function and a correction term.

6. The method of claim 1, wherein the target mutual information is associated with at least one reliability metric.

7. The method of claim 1, wherein the at least one reliability metric is associated with a capacity of at least one of the bit-channels to successfully convey at least some of the information bits.

8. The method of claim 1, further comprising associating at least one of the bit-channel partitions with a first group, and associating at least one other of the bit-channel partitions with a second group.

9. The method of 8, wherein the first group comprises a lower reliability group, and the second group comprises a higher reliability group.

10. The method of claim 1, wherein at least some of the repeated bit locations are at least in part indicative that other bit locations of the codeword are blank.

11. The method of claim 1, wherein the recursively partitioning bit-channels of the polar code for each stage of polarization occurs prior to the assigning.

12. The method of claim 11, wherein the recursively partitioning the bit-channels is based at least in part on allocating a threshold number of bit locations to more than one of the bit-channels.

13. The method of claim 1, wherein the target mutual information is based at least in part on the mutual information transfer function.

14. A method for wireless communication, comprising:
   receiving an encoded codeword over a wireless channel via a wireless communication interface configured to receive wireless data signals;
   identifying a set of bit locations of a polar code used for information bits for the encoding,
   wherein the set of bit locations is identified based at least in part on recursively partitioning bit-channels of the polar code for each stage of polarization and assigning portions of a number of the information bits to bit-channel partitions of each stage of polarization based at least in part on a mutual information transfer function of respective aggregate capacities of the bit-channel partitions, wherein the mutual information transfer function is based at least in part on a binary erasure channel (BEC) function and a correction term, and wherein zero information bits are assigned to a first bit-channel partition of the first polarization stage, the first bit-channel partition corresponding to the set of repeated bit locations; and processing the received codeword according to the polar code to obtain an information bit vector at the set of bit locations.

15. The method of claim 14, wherein the correction term is based at least in part on a function of a bit-channel capacity of the each stage of polarization and a capacity imbalance factor.

16. The method of claim 15, wherein the correction term comprises at least one of: an offset factor applied to the bit-channel capacity, a scaling factor applied to the offset bit-channel capacity, or an offset applied to the scaled and offset bit-channel capacity.

17. The method of claim 14, wherein the mutual information transfer function is based at least in part on at least one reliability metric.

18. The method of claim 14, further comprising associating at least one of the bit-channel partitions with a lower reliability group, and associating at least one other of the bit-channel partitions with a higher reliability group.

19. An apparatus for wireless communication, in a system comprising:
a processor;
a non-transitory memory in electronic communication with the processor; and
instructions stored in the memory and operable, when executed by the processor, to cause the apparatus to:
receive an encoded codeword over a wireless channel via a wireless communication interface configured to receive wireless data signals;
identify a set of repeated bit locations in the received codeword;
identify a set of bit locations of a polar code used for information bits for the encoding,
wherein the set of bit locations is identified based at least in part on recursively partitioning bit-channels of the polar code for each stage of polarization and assigning portions of a number of the information bits to bit-channel partitions of each stage of polarization based at least in part on a mutual information transfer function of respective aggregate capacities of the bit-channel partitions,
wherein a target mutual information for a first polarization stage is determined as a function of the number of the information bits and a number of bit locations in the received codeword, and
wherein zero information bits are assigned to a first bit-channel partition of the first polarization stage, the first bit-channel partition corresponding to the set of repeated bit locations; and
decode the received codeword according to the polar code to obtain an information bit vector at the set of bit locations.

20. The apparatus of claim 19, further comprising determining that the target mutual information is greater than the number of the information bits divided by the number of bit locations in the received codeword.

21. The apparatus of claim 19, further comprising determining, for the each stage of polarization, a capacity of each bit-channel of each of the bit-channel partitions, based at least in part on bit-channel capacities of input bit-channels from the previous stage of polarization and the mutual information transfer function.

22. The apparatus of claim 19, wherein the set of repeated bit locations correspond to at least one of a most significant bit portion of the received codeword, a least significant bit portion of the received codeword, an intermediate portion of the received codeword between a most significant bit and a least significant bit, or a combination thereof.

23. The apparatus of claim 19, wherein the mutual information transfer function is based at least in part on a binary erasure channel (BEC) function and a correction term.

24. The apparatus of claim 19, wherein the target mutual information is associated with at least one reliability metric.

25. The apparatus of claim 19, further comprising associating at least one of the bit-channel partitions with a lower reliability group, and associating at least one other of the bit-channel partitions with a higher reliability group.

26. An apparatus for wireless communication, in a system comprising:
a processor;
a non-transitory memory in electronic communication with the processor; and
instructions stored in the memory and operable, when executed by the processor, to cause the apparatus to:
receive an encoded codeword over a wireless channel via a wireless communication interface configured to receive wireless data signals;
identify a set of bit locations of a polar code used for information bits for the encoding,
wherein the set of bit locations is determined based at least in part on recursively partitioning bit-channels of the polar code for each stage of polarization and assigning portions of a number of the information bits to bit-channel partitions of each stage of polarization based at least in part on a mutual information transfer function of respective aggregate capacities of the bit-channel partitions,
wherein the mutual information transfer function is based at least in part on a binary erasure channel (BEC) function and a correction term, and
wherein zero information bits are assigned to a first bit-channel partition of the first polarization stage, the first bit-channel partition corresponding to the set of repeated bit locations; and
process the received codeword according to the polar code to obtain an information bit vector at the set of bit locations.

27. The apparatus of claim 26, wherein the correction term is based at least in part on a function of a bit-channel capacity of the each stage of polarization and a capacity imbalance factor.

28. The apparatus of claim 27, wherein the correction term comprises at least one of: an offset factor applied to the bit-channel capacity, a scaling factor applied to the offset bit-channel capacity, or an offset applied to the scaled and offset bit-channel capacity.

29. The apparatus of claim 26, wherein the mutual information transfer function is based at least in part on at least one reliability metric.

30. The apparatus of claim 26, further comprising associating at least one of the bit-channel partitions with a lower reliability group, and associating at least one other of the bit-channel partitions with a higher reliability group.

\* \* \* \* \*